(12) United States Patent
Wang et al.

(10) Patent No.: US 12,376,321 B2
(45) Date of Patent: Jul. 29, 2025

(54) SEMICONDUCTOR DEVICE WITH SILICIDE STRUCTURES SURROUNDING EPITAXIAL STRUCTURES AND METHOD OF MAKING THE SAME

(71) Applicant: TAIWAN SEMICONDUCTOR MANUFACTURING COMPANY, LTD., Hsinchu (TW)

(72) Inventors: Chen-Han Wang, Hsinchu (TW); Keng-Chu Lin, Hsinchu (TW); Shuen-Shin Liang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 583 days.

(21) Appl. No.: 17/675,108

(22) Filed: Feb. 18, 2022

(65) Prior Publication Data
US 2023/0268422 A1    Aug. 24, 2023

(51) Int. Cl.
*H10D 30/01*    (2025.01)
*H10D 30/62*    (2025.01)
*H10D 62/17*    (2025.01)

(52) U.S. Cl.
CPC ....... *H10D 30/024* (2025.01); *H10D 30/6211* (2025.01); *H10D 62/235* (2025.01)

(58) Field of Classification Search
CPC . H01L 21/71; H01L 21/768; H01L 21/76838; H01L 21/76877; H01L 21/76879; H01L 21/41783; H01L 21/823418; H01L 21/823814; H01L 21/76843; H01L 21/76855; H01L 21/28518; H01L 23/485; H10D 64/017; H10D 64/251; H10D 30/024; H10D 30/6211; H10D 30/014; H10D 30/43; H10D 30/6219; H10D 30/62; H10D 62/235; H10D 62/151; H10D 62/121; H10D 62/822
See application file for complete search history.

(56) References Cited

U.S. PATENT DOCUMENTS

2020/0035787 A1*  1/2020  Wang .................... H01L 23/485
2020/0135874 A1*  4/2020  Shih ................ H01L 21/823814

\* cited by examiner

*Primary Examiner* — Julio J Maldonado
*Assistant Examiner* — Stanetta D Isaac
(74) *Attorney, Agent, or Firm* — Birch, Stewart, Kolasch & Birch, LLP

(57) ABSTRACT

A semiconductor device includes a semiconductor substrate, a channel region, a gate structure, two epitaxial structures, and two silicide structures. The channel region is disposed on the semiconductor substrate. The gate structure is disposed on the semiconductor substrate and over the channel region. The epitaxial structures are connected at opposite ends of the channel region and are disposed opposite to each other relative to the gate structure. The silicide structures respectively surround the epitaxial structures. A method of manufacturing a semiconductor device is also provided.

20 Claims, 15 Drawing Sheets

SEMICONDUCTOR DEVICE WITH SILICIDE STRUCTURES SURROUNDING EPITAXIAL STRUCTURES AND METHOD OF MAKING THE SAME

BACKGROUND

With the continuous development of semiconductor technology, geometry size of semiconductor devices has decreased, which may bring new challenges to design and manufacturing of the semiconductor devices. One of the challenges faced by modern semiconductor engineers is the increase of resistance in semiconductor devices due to the reduction of geometry size or other factors, which needs to be address in order to make faster and more energy efficient devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
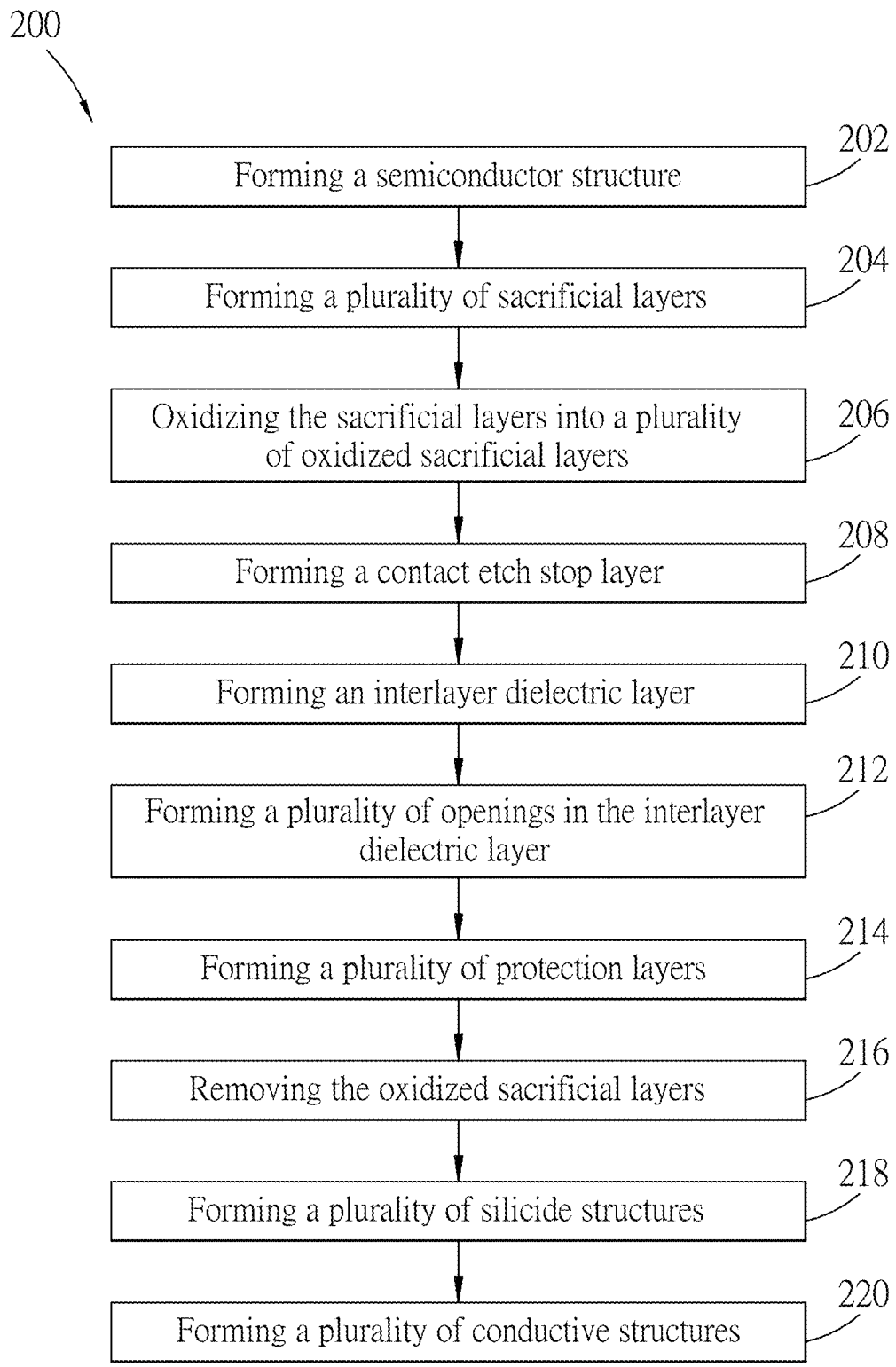
FIG. 1 is a flow chart illustrating a method of manufacturing a semiconductor device in accordance with some embodiments of this disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 200 of manufacturing a semiconductor device 300 (see FIG. 19) in accordance with some embodiments of this disclosure. FIGS. 2 to 19 are schematic views showing intermediate stages of the method 200 as depicted in FIG. 1. Additional steps which are not limited to those described in the method 200, can be provided before, during or after manufacturing of the semiconductor device 300, and some of the steps described herein may be replaced by other steps or be eliminated. Similarly, additional features may be present in the semiconductor device 300, and/or features present may be replaced or eliminated in additional embodiments.

Figure 2:
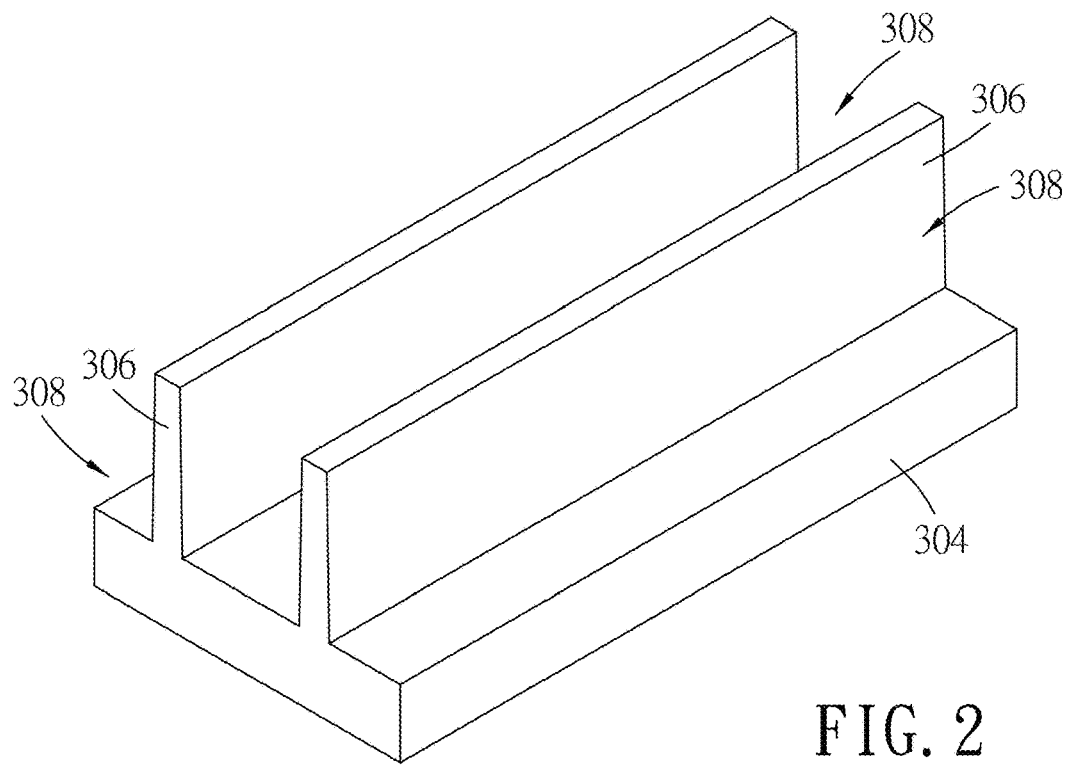
FIGS. 2 to 19 show intermediate steps of a method of manufacturing a semiconductor device in accordance with some embodiments of this disclosure.

Referring to FIG. 1, the method 200 begins at step 202, where a semiconductor structure 302 (see FIG. 9) is formed. Referring to FIG. 2, in the process of forming the semiconductor structure 302, a semiconductor substrate 304 is first formed.

In some embodiments, the semiconductor substrate 304 may be a suitable substrate, such as an elemental semiconductor or a compound semiconductor. The elemental semiconductor may contain a single species of atom, such as Si, Ge or other suitable materials, e.g., another element from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, other suitable materials, or any combination thereof.

Then, the semiconductor substrate 304 is etched, so that a plurality of fins 306 are formed over the semiconductor substrate 304. Only two fins 306 are schematically shown in FIG. 2, but the number of the fins 306 may be changed according to practical requirements. In some embodiments, the semiconductor substrate 304 may be etched by using a hard mask (not shown) serving as an etching mask. In some embodiments, the hard mask may include a pad oxide layer disposed on the semiconductor substrate 304, and a pad nitride layer disposed on the pad oxide layer. In some embodiments, each of the pad oxide layer and the pad nitride layer may be made of chemical vapor deposition (CVD), physical vapor deposition (PVD), atomic layer deposition (ALD), other suitable techniques, or any combination thereof.

Figure 3:
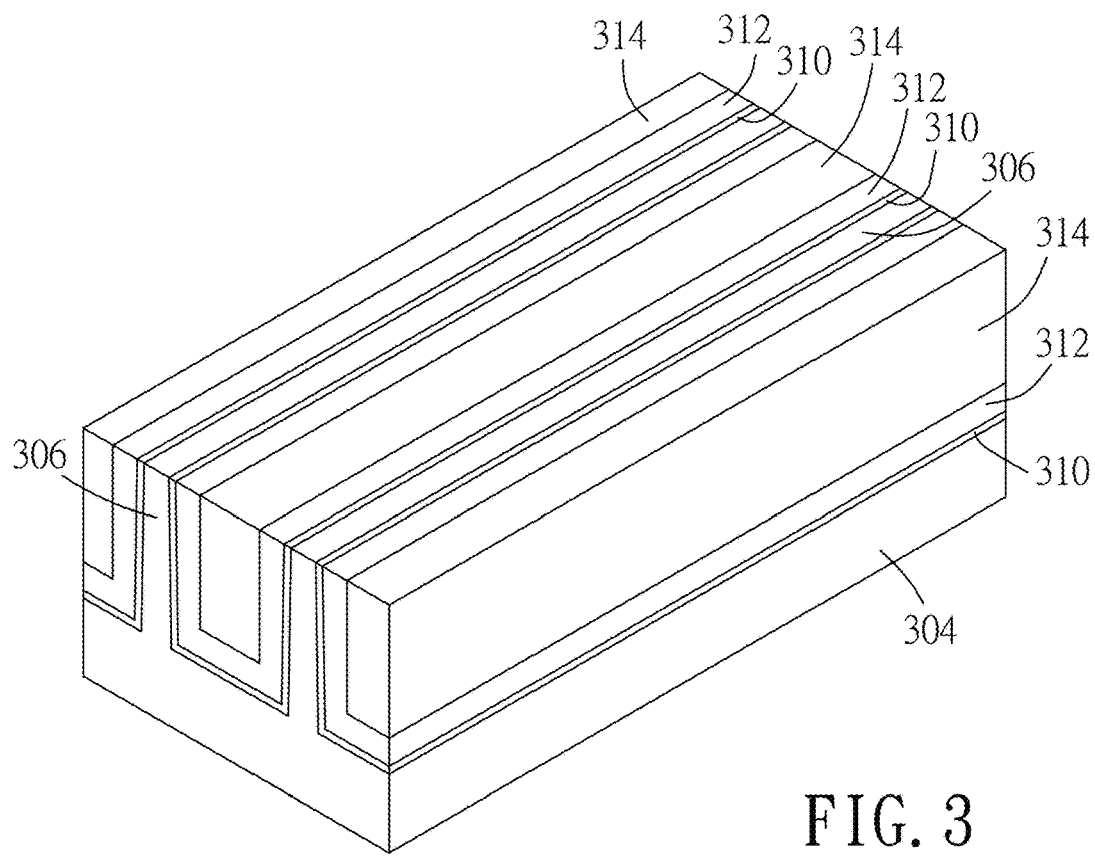

Referring to FIG. 3, in some embodiments, after forming the fins 306, a plurality of liner layers 310 are respectively formed in interspaces 308 (see FIG. 2) adjoining the fins 306, a plurality of spacer layers 312 are respectively formed on the liner layers 310 and in the interspaces 308, and a plurality of isolation layers 314 are respectively formed on the spacer layers 312 and in the interspaces 308. In some embodiments, the liner layers 310, the spacer layers 312 and the isolation layers 314 may be formed by depositing materials corresponding to the layers in the interspaces 308 and over the fins 306, followed by removing the deposited materials by chemical mechanical planarization (CMP), etching back (e.g., dry etching), other suitable techniques, or any combination thereof, until the fins 306 are exposed. In some embodiments, the liner layers 310 may be made of silicon oxide, silicon nitride, silicon oxynitride, other suitable materials, or any combination thereof. In some embodiments, the liner layers 310 may be deposited by chemical vapor deposition (CVD) (including low pressure CVD (LPCVD), plasma-enhanced CVD (PECVD), high density plasma CVD (HDPCVD), flowable CVD (FCVD), or other suitable CVD-based techniques), ALD, other suitable techniques, or any combination thereof. In some embodiments, the spacer layers 312 may be made of silicon oxide, silicon nitride, silicon oxynitride, other suitable materials, or any combination thereof. In some embodiments, the spacer layers 312 may be deposited by CVD (including LPCVD, PECVD, HDPCVD, FCVD, or other suitable CVD-based techniques), ALD, other suitable techniques, or any combination thereof. In some embodiments, the isolation layers 314 may be made of oxide-based materials (e.g., silicon oxide or other suitable materials), nitride-based materials (e.g., silicon nitride or other suitable materials), carbide-based materials (e.g., silicon oxycarbide or other suitable materials), other suitable materials, or any combination thereof.

Figure 4:
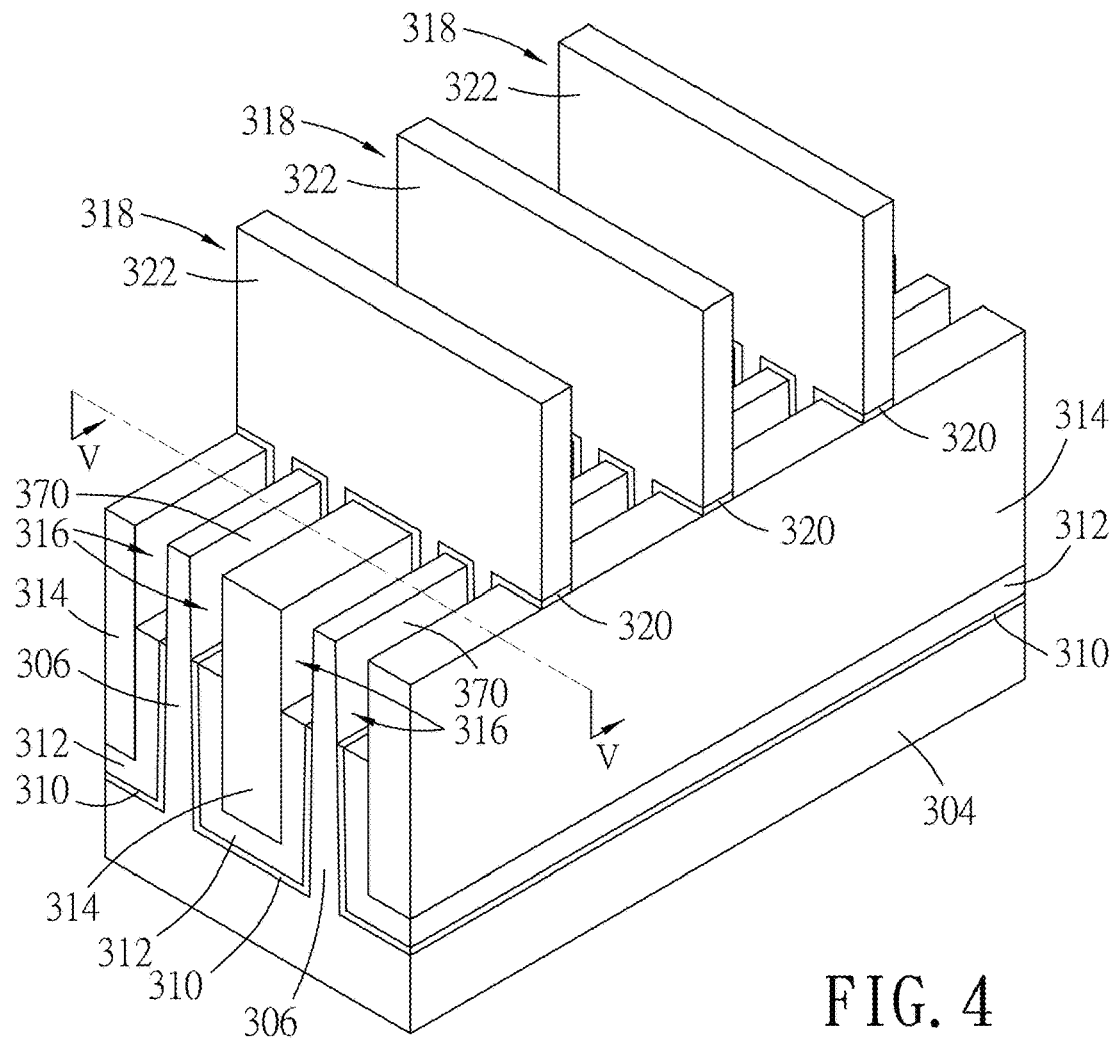
Figure 5:
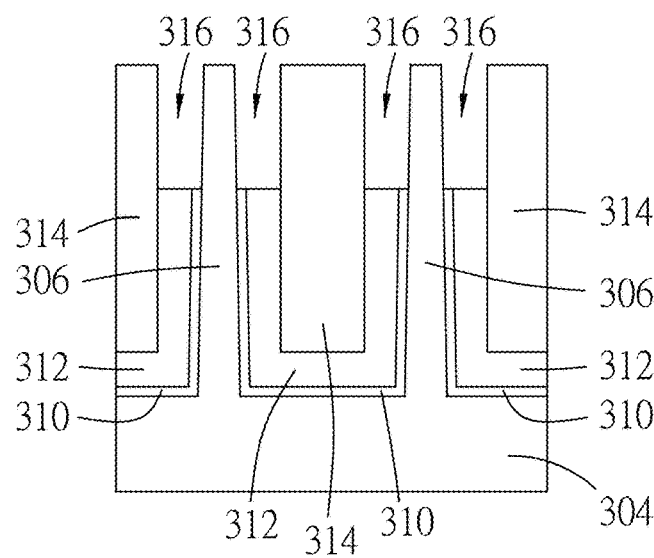

Then, referring to FIGS. 4 and 5, where FIG. 5 is a schematic sectional view taken along line V-V of FIG. 4, after the formation of the liner layers 310, the spacer layers 312 and the isolation layers 314, the liner layers 310 and the spacer layers 312 are etched to form a plurality of recesses 316. In some embodiments, the etching process may be conducted by using dry etching techniques, wet etching techniques, other suitable techniques, or any combination thereof. The depth of the recesses 316 may be determined according to practical requirements. Afterwards, a plurality of dummy gate structures 318 are formed across and over the fins 306. In other words, the dummy gate structures 318 cover a part of top surfaces of the fins 306 and a part of side walls of the fins 306. There are three dummy gate structures 318 schematically shown in FIG. 4, but the number of the dummy gate structures 318 may be changed according to practical requirements. In some embodiments, each of the dummy gate structures 318 includes a dummy gate dielectric layer 320 that is formed across and over the fins 306, and a dummy gate electrode layer 322 that is disposed on the dummy gate dielectric layer 320. In some embodiments, the dummy gate dielectric layer 320 of each of the dummy gate structures 318 may be made of silicon oxide, silicon nitride, silicon oxynitride, $HfO_2$, HfSiO, HfTiO, HfAlO, HfZrO, other suitable materials, or any combination thereof. In some embodiments, the dummy gate dielectric layer 320 of each of the dummy gate structures 318 may be made by PVD, CVD, ALD, other suitable techniques, or any combination thereof. In some embodiments, the dummy gate electrode layer 322 of each of the dummy gate structures 318 may be made of polycrystalline silicon, polycrystalline silicon germanium (SiGe), metal nitride, metal silicide, metal, other suitable materials, or any combination thereof. In some embodiments, the dummy gate electrode layer 322 of each of the dummy gate structures 318 may be made by PVD, CVD, other suitable techniques, or any combination thereof.

Figure 6:
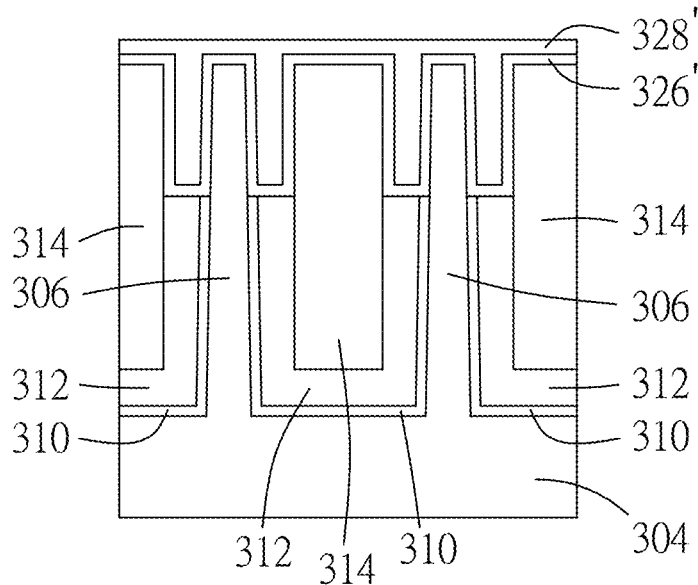

Then, referring to FIG. 6, in some embodiments, after the formation of the dummy gate structures 318 (see FIG. 4), a first spacer layer 326' is formed in the recesses 316 (see FIG. 5) and on the fins 306 and the isolation layers 314, and then a second spacer layer 328' is formed on the first spacer layer 326'. In some embodiments, the first spacer layer 326' may be made of oxide-based materials (e.g., silicon oxide, etc.), nitride-based materials (e.g., silicon nitride, silicon carbon nitride, silicon oxynitride, tantalum nitride, titanium nitride, etc.), carbide-based materials (e.g., silicon oxycarbide), other suitable materials, or any combination thereof. In some embodiments, the second spacer layer 328' may be made of oxide-based materials (e.g., silicon oxide, etc.), nitride-based materials (e.g., silicon nitride, silicon carbon nitride, silicon oxynitride, tantalum nitride, titanium nitride, etc.), carbide-based materials (e.g., silicon oxycarbide), other suitable materials, or any combination thereof. The first spacer layer 326' and the second spacer layer 328' may be made of the same material or different materials.

Figure 7:
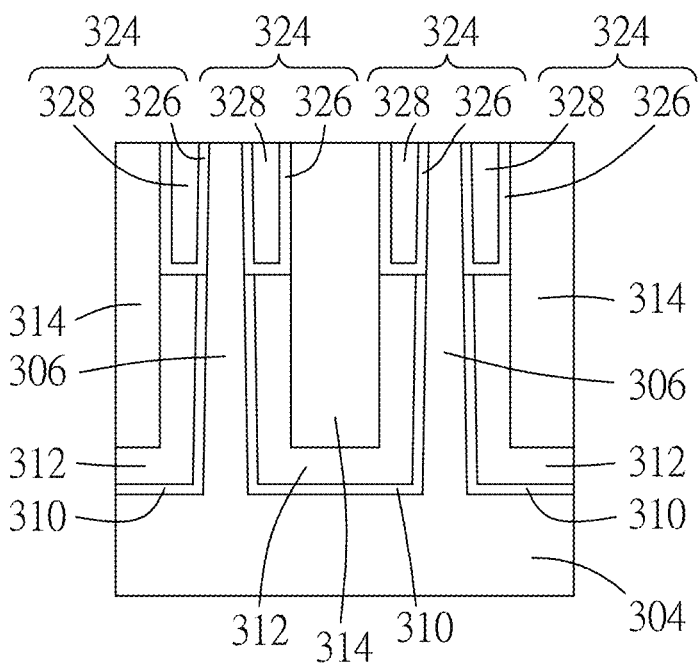

Then, referring to FIG. 7, in some embodiments, the first spacer layer 326' and the second spacer layer 328' (see FIG. 6) over the fins 306 and the isolation layers 314 are removed by CMP, etching back (e.g., dry etching), other suitable techniques, or any combination thereof, thereby forming a plurality of spacer structures 324 each including a first spacer 326 that is part of the first spacer layer 326' and a second spacer 328 that is part of the second spacer layer 328'. In FIG. 7, each of the spacer structures 324 is illustrated to be a bi-layer structure, the number of layer(s) of each of the spacer structures 324 may be changed according to practical requirements.

Figure 8:
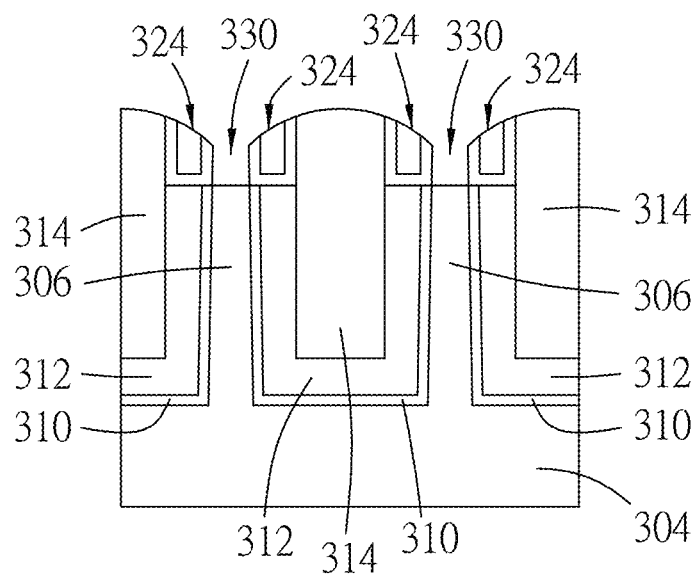

Then, referring to FIG. 8, in some embodiments, parts of the isolation layers 314, the spacer structures 324, and the fins 306 not covered by (i.e., outside of) the dummy gate structures 318 (see FIG. 4) are recessed to lower the heights of the isolation layers 314, the spacer structures 324, and the fins 306. The recessed fins 306 has a surface lower than the recessed spacer structures 324, thereby forming a plurality of trenches 330 each adjoining corresponding two of the spacer structures 324. The depth of the trenches 330 may be changed according to practical requirements.

Figure 9:
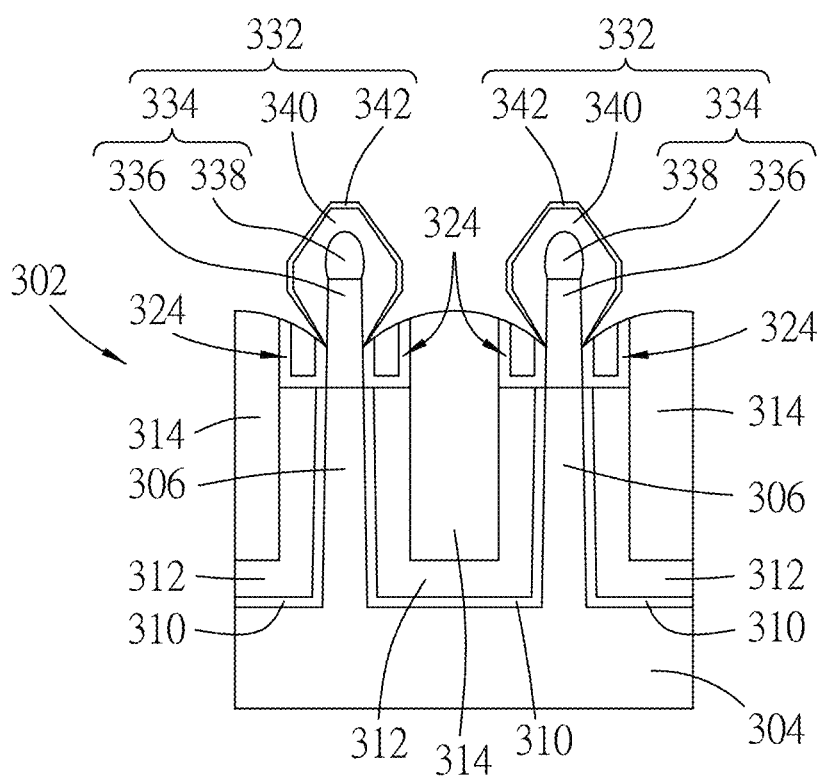

Then, referring to FIG. 9, in some embodiments, a plurality of epitaxial structures 332 (e.g., source/drain) are respectively formed in the trenches 330 (see FIG. 8) and extend over the trenches 330, thereby obtaining the semiconductor structure 302.

In some embodiments, each of the epitaxial structures 332 may include a first epitaxial layer 334, a second epitaxial layer 340 and a third epitaxial layer 342 (i.e., an outermost layer of the epitaxial structure 332), and the first epitaxial layer 334 may include a first epitaxial sub-layer 336 and a second epitaxial sub-layer 338. In some embodiments, each of the first epitaxial sub-layer 336 of the first epitaxial layer 334, the second epitaxial sub-layer 338 of the first epitaxial layer 334, the second epitaxial layer 340 and the third epitaxial layer 342 may be made of Si, Ge, SiGe, GaAs, AlGaAs, GaAsP, SiP, SiC, SiCP, InAs, AlAs, InP, GaN, InGaAs, InAlAs, GaSb, AlSb, AlP, GaP, other suitable III-V compound semiconductor materials, other suitable II-VI compound semiconductor materials, other suitable materials, or any combination thereof. In some embodiments, each of the first epitaxial sub-layer 336 of the first epitaxial layer 334, the second epitaxial sub-layer 338 of the first epitaxial layer 334, the second epitaxial layer 340 and the third epitaxial layer 342 may be made by metal-organic CVD (MOCVD), molecular beam epitaxy (MBE), liquid phase epitaxy (LPE), vapor phase epitaxy (VPE), selective epitaxial growth (SEG), other suitable techniques, or any combination thereof. In some embodiments, at least one of the first epitaxial sub-layer 336 and the second epitaxial sub-layer 338 may be omitted. In some embodiments, at least one of the first epitaxial layer 334, the second epitaxial layer 340 and the third epitaxial layer 342 may be omitted; and in other embodiments, there may be extra epitaxial layer(s) surrounding the third epitaxial layer 342. The shape of the epitaxial structures 332 is not limited to that shown in FIG. 9, and may be changed according to practical selection of materials.

Figure 10:
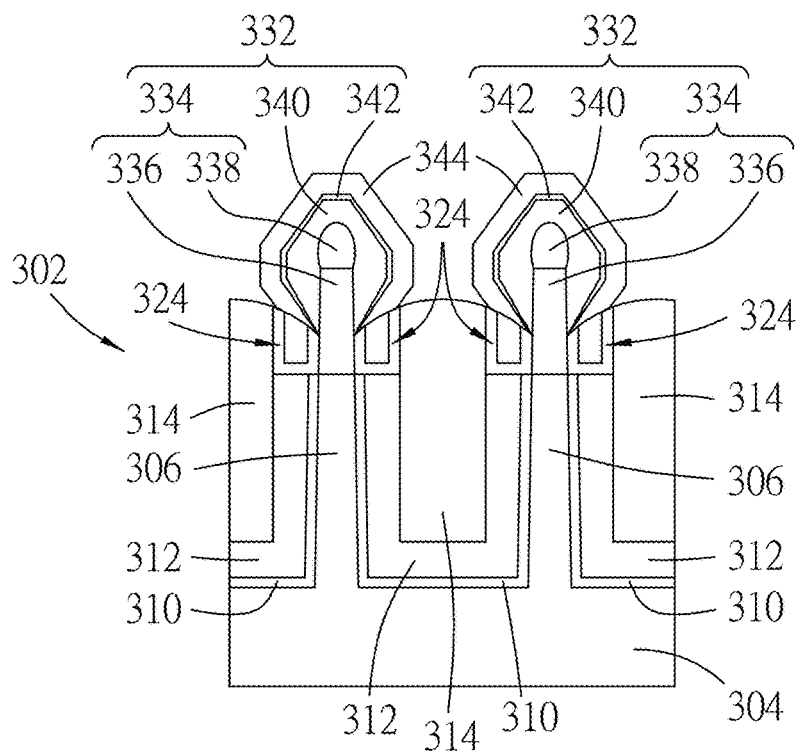

Referring to FIG. 1, in some embodiments, after the semiconductor structure is formed in step 202, the method 200 proceeds to step 204, where a plurality of sacrificial layers are formed. Referring to FIG. 10, the sacrificial layers 344 are respectively formed on and surrounding and/or enclosing the third epitaxial layers 342 of the epitaxial structures 332. In some embodiments, the epitaxial structures 332 may be made of Si, Ge, SiGe, GaAs, AlGaAs, GaAsP, SiP, SiC, SiCP, InAs, AlAs, InP, GaN, InGaAs, InAlAs, GaSb, AlSb, AlP, GaP, other suitable III-V compound semiconductor materials, other suitable II-VI compound semiconductor materials, other suitable materials, or any combination thereof. In some embodiments, the epitaxial structures 332 may be made by MOCVD, MBE, LPE, VPE, SEG, other suitable techniques, or any combination thereof.

Figure 11:
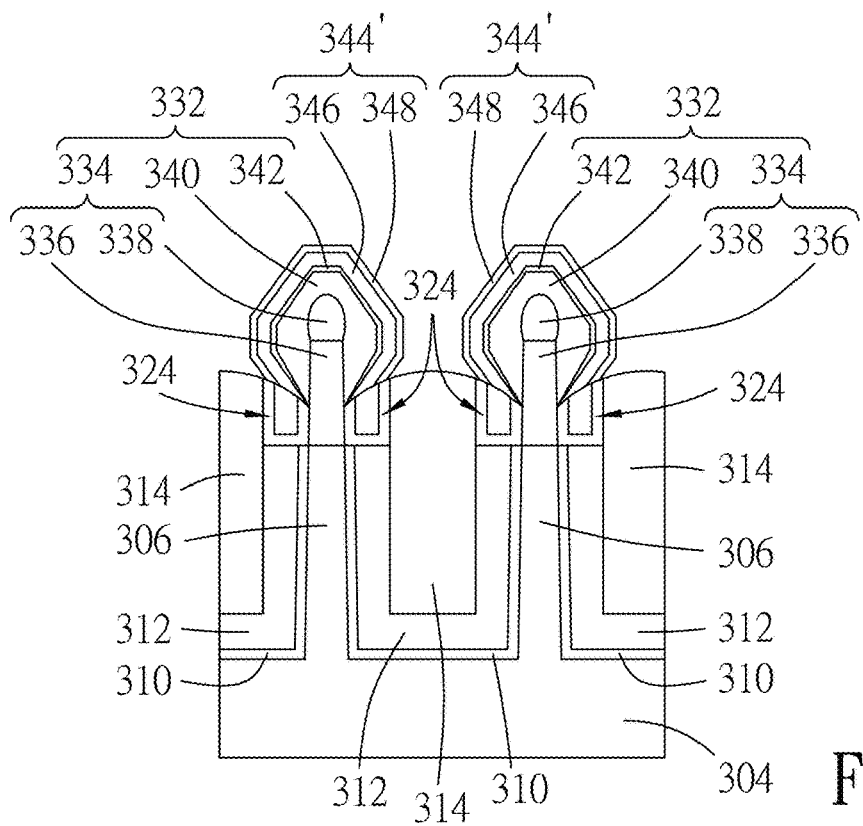

Referring to FIG. 1, in some embodiments, after the formation of the sacrificial layers in step 204, the method 200 proceeds to step 206, where the sacrificial layers are oxidized. Referring to FIGS. 10 and 11, the third epitaxial layer 342 of each of the epitaxial structures 332 is exemplified to be made of SiGe with Ge content less than about 25 atomic percent, but other range of values are also within the scope of this disclosure. In some embodiments, the third epitaxial layer 342 of each of the epitaxial structures 332 may be exemplified to be made of SiGe with Ge content ranging from about 20 atomic percent to about 25, from about 15 atomic percent to about 20 atomic percent, from about 10 atomic percent to about 15 atomic percent, from about 5 atomic percent to about 10 atomic percent, from about 0 atomic percent to about 5 atomic percent, or may be in other ranges. In some embodiments, the sacrificial layers 344 are exemplarily made of SiGe with Ge content ranging from about 30 atomic percent to about 80 atomic percent, but other range of values are also within the scope of this disclosure. In some embodiments, the sacrificial layers 344 may be exemplarily made of SiGe with Ge content ranging from about 30 atomic percent to about 35 atomic percent, from about 35 atomic percent to about 40 atomic percent, from about 45 atomic percent to about 50 atomic percent, from about 50 atomic percent to about 55 atomic percent, from about 55 atomic percent to about 60 atomic percent, from about 60 atomic percent to about 65 atomic percent, from about 65 atomic percent to about 70 atomic percent, from about 70 atomic percent to about 75 atomic percent, from about 75 atomic percent to about 80 atomic percent, or may be in other ranges. In some embodiments, the sacrificial layers 344 may be oxidized by using steam, a combination of steam and hydrogen peroxide, other suitable oxidizers, or any combination thereof, in a temperature ranging from about 300° C. to about 600° C., but other range of values are also within the scope of this disclosure. In some embodiments, the third epitaxial layer 342 of each of the epitaxial structures 332 may have a thickness ranging from about 1 nm to about 5 nm, but other range of values are also within the scope of this disclosure. In some embodiments, the thickness of the third epitaxial layer 342 of each of the epitaxial structures 332 may range from about 1 nm to about 2 nm, may range from about 2 nm to about 3 nm, may range from about 3 nm to about 4 nm, may range from about 4 nm to about 5 nm, or may be in other ranges. During the oxidation process, the third epitaxial layer 342 of each of the epitaxial structures 332 may serve as an oxidation stop layer, which may prevent the epitaxial structures 332 from being oxidized (i.e., the oxidation reaction terminates at the third epitaxial layer 342 (i.e., the outermost layer) of each of the epitaxial structures 332). Therefore, with such oxidation stop layer, loading effect of the oxidation process may be minimized or even eliminated. In some embodiments, if the content of Ge in the third epitaxial layer 342 of each of the epitaxial structures 332 is too high, such as greater than about 25 atomic percent, the third epitaxial layer 342 of each of the epitaxial structures 332 may be oxidized during the oxidization process. In some embodiments, if the content of Ge in the sacrificial layers 344 is too low, such as less than about 30 atomic percent, the sacrificial layers 344 may not be properly and/or thoroughly oxidized during the oxidation process. In some embodiments, if the content of Ge in the sacrificial layers 344 is too high, such as greater than about 80 atomic percent, the sacrificial layers 344 may be oxidized too easily, rendering the third epitaxial layers 342 of the epitaxial structures 332 unable to stop the oxidation process and resulting in the oxidation of the second and third epitaxial layers 340, 342 of each of the epitaxial structures 332. In some embodiments, if the oxidation temperature is too low, such as lower than about 300° C., the sacrificial layers 344 may not be properly and/or thoroughly oxidized during the oxidation process. In some embodiments, if the oxidation temperature is too high, such as higher than about 600° C., the third epitaxial layers 342 of the epitaxial structures 332 may not be able to stop the oxidation process, resulting in the oxidation of the second epitaxial layer 340 of each of the epitaxial structures 332. In some embodiments, if the thickness of the third epitaxial layer 342 of each of the epitaxial structures 332 is too small, such as smaller than about 1 nm, the third epitaxial layers 342 of the epitaxial structures 332 may not be able to stop the oxidation process, resulting in the oxidation of the second epitaxial layer 340 of each of the epitaxial structures 332. In some embodiments, if the thickness of the third epitaxial layer 342 of each of the epitaxial structures 332 is too large, such as larger than about 5 nm, the overall dimensions and resistance of the epitaxial structures 332 may be increased. In some embodiments, the sacrificial layers 344 may be made of a material that can be oxidized, and the third epitaxial layers 342 of the epitaxial structures 332 may be made of a material that is less likely to be oxidized as compared to the sacrificial layers 344 (i.e., the sacrificial layers 344 are more likely or are easily oxidized as compared to the third epitaxial layers 342 of the epitaxial structures 332).

As shown in FIG. 11, in some embodiments, each of the sacrificial layers 344 (see FIG. 10) may be oxidized into an oxidized sacrificial layer 344'. In some embodiments, each of the oxidized sacrificial layer 344' may include a first oxidized layer 346 enclosing the third epitaxial layers 342 of a respective one of the epitaxial structures 332, and a second oxidized layer 348 enclosing the first oxidized layer 346. In some embodiments, as a result of oxidizing the sacrificial layers 344, the first oxidized layers 346 may include SiGeOx. In some embodiments, the second oxidized layers 348 may include SiOx, as a result of more thorough oxidation of the sacrificial layers 344 where germanium in the sacrificial layers 344 may be oxidized and removed (e.g., evaporated). In some embodiments, the second oxidized layers 348 may have porous structures due to the removal of germanium during the oxidation process. In some embodiments, each of the sacrificial layers 344 may be oxidized into the oxidized sacrificial layer 344' without including two sub-layers, and the oxidized sacrificial layer 344' may include of SiGeOx, SiOx, other suitable materials, or any combination thereof.

Figure 12:
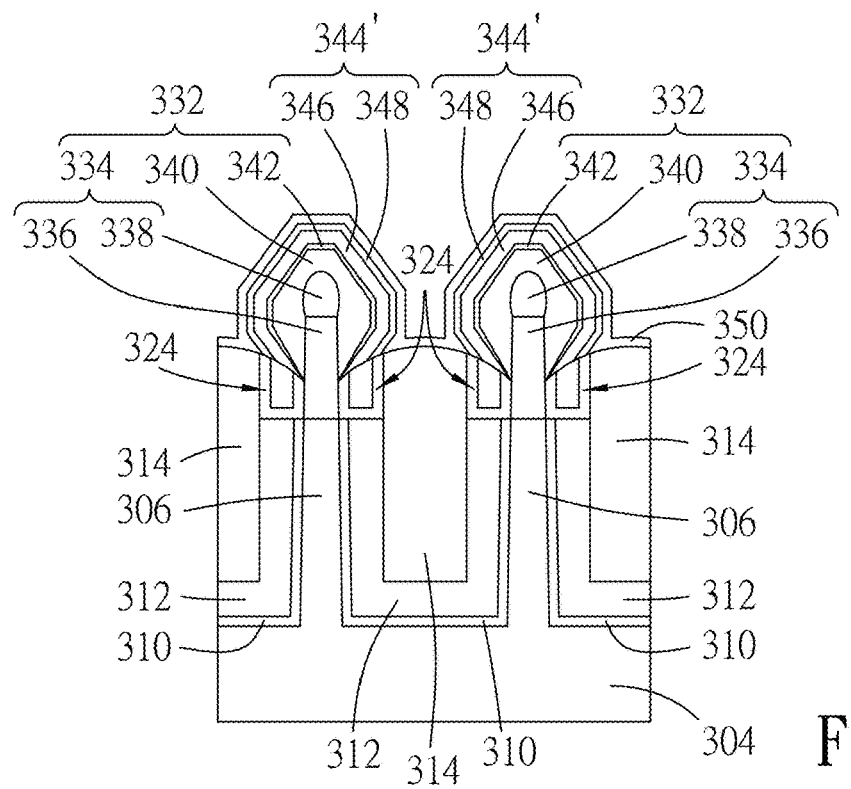

Referring to FIG. 1, in some embodiments, after the oxidation of the sacrificial layers, the method 200 proceeds to step 208, where a contact etch stop layer is formed. Referring to FIG. 12, the contact etch stop layer 350 is formed to cover the second oxidized layers 348 of the oxidized sacrificial layers 344', the isolation layers 314 and the dummy gate structures 318 (see FIG. 4). In some embodiments, the contact etch stop layer 350 may be made of silicon oxide, silicon nitride, silicon oxynitride, other suitable materials, or any combination thereof. In some embodiments, the contact etch stop layer 350 may be formed by CVD (including PECVD, etc.), ALD, other suitable techniques, or any combination thereof.

Figure 13:
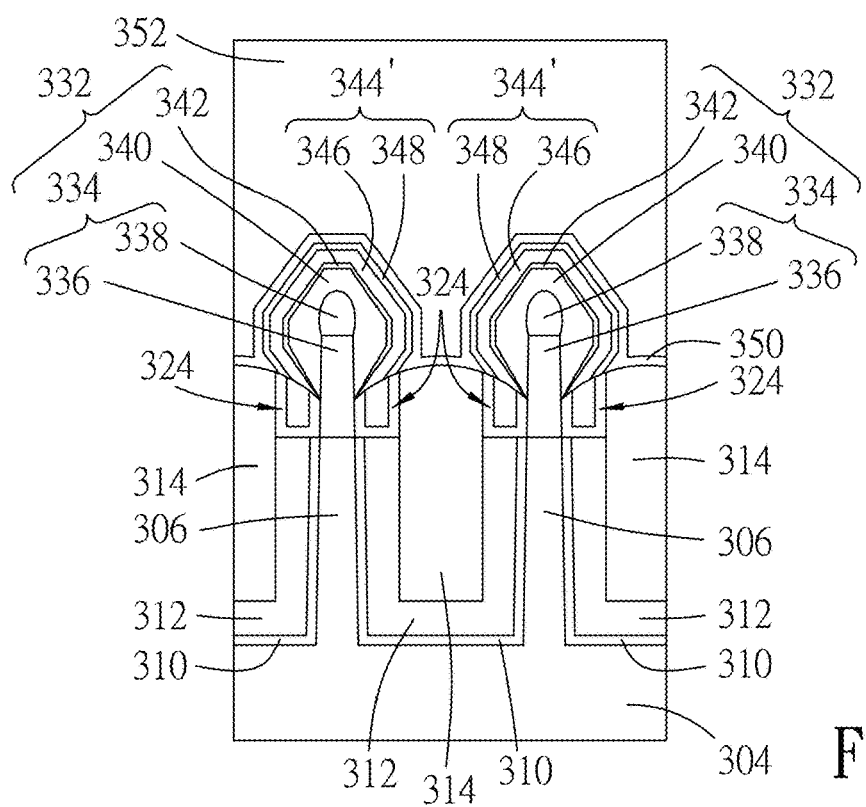

Referring to FIG. 1, in some embodiments, after the formation of the contact etch stop layer, the method 200 proceeds to step 210, where an interlayer dielectric layer is formed. Referring to FIG. 13, the interlayer dielectric layer 352 is formed over the contact etch stop layer 350. In some embodiments, the interlayer dielectric layer 352 may be made of silicon oxide, phosphosilicate glass (PSG), borophosphosilicate glass (BPSG), undoped silicate glass (USG), fluorosilicate glass (FSG), polyimide, other suitable materials, or any combination thereof. In some embodiments, the interlayer dielectric layer 352 may be made by CVD, ALD, PVD, other suitable techniques, or any combination thereof.

Figure 26:
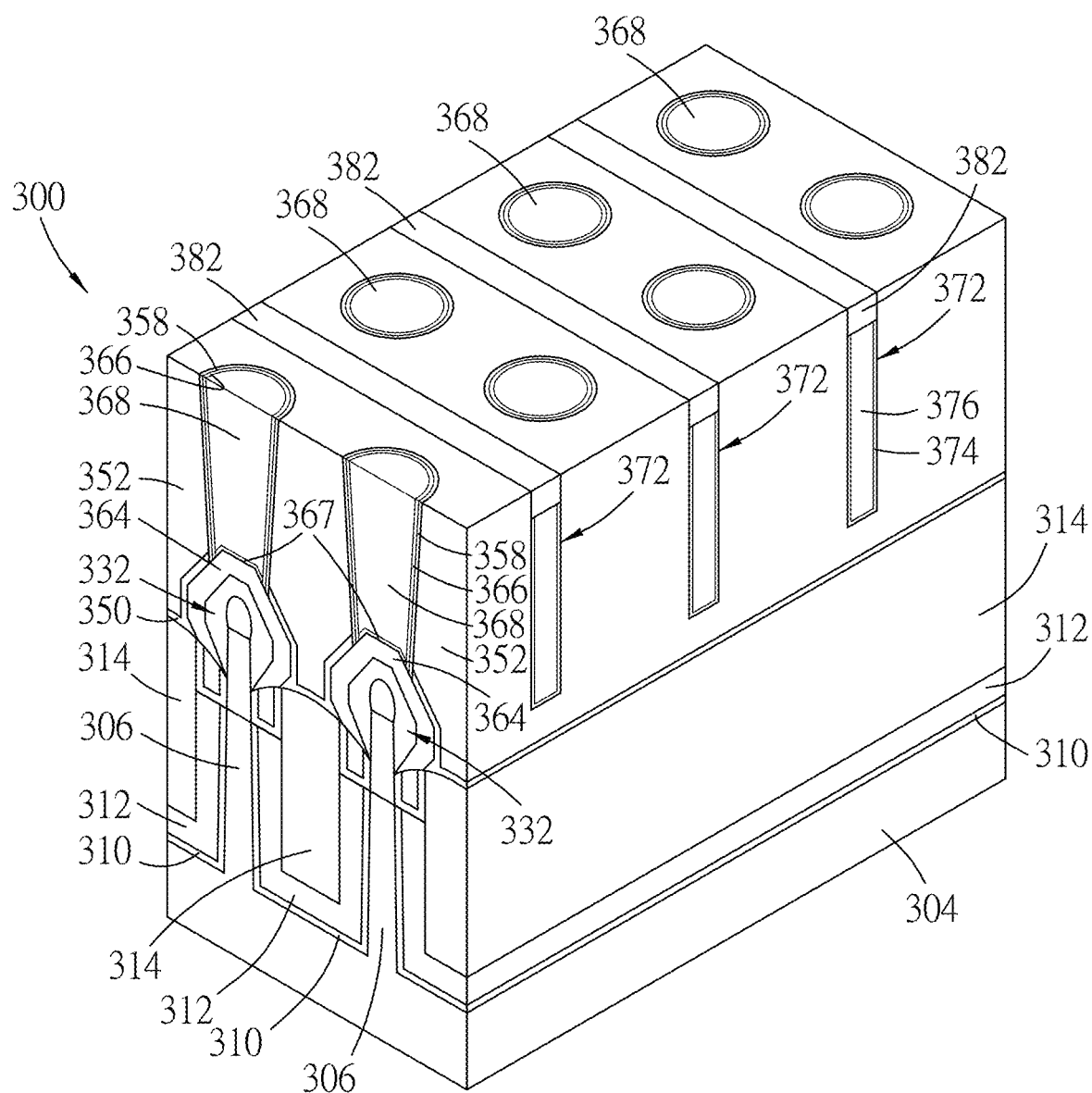
FIG. 26 is a schematic perspective view of a semiconductor device in accordance with some embodiments of this disclosure.

In some embodiments, after the formation of the interlayer dielectric layer 352, a planarization process, such as CMP, etching back, other suitable techniques, or any combination thereof, may be performed to remove a top portion of the interlayer dielectric layer 352 and a top portion of the contact etch stop layer 350 until the dummy gate structures 318 (see FIG. 4) are exposed from the interlayer dielectric layer 352 and the contact etch stop layer 350. Then, a replacement metal gate process may be performed to form a plurality of gate structures 372 (see FIG. 26) to respectively replace the dummy gate structures 318. Referring to FIGS. 4 and 26, in some embodiments, the dummy gate dielectric layer 320 of each of the dummy gate structures 318 may be replaced by a dielectric layer 374 which may be made of a high-k dielectric material, such as a metal oxide or a silicate of Hf, Al, Ga, Ta, Gd, Y, Zr, La, Mg, Ba, Ti, Pb, other suitable materials, or any combination thereof, and which may be made by ALD, CVD, other suitable techniques, or any combination thereof. In some embodiments, the dummy gate electrode layer 322 of each of the dummy gate structures 318 may be replaced by a gate electrode layer 376 made of polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, other suitable materials, or any combination thereof, which may be made by ALD, CVD, plating (including electroplating, electroless plating, etc.), other suitable techniques, or any combination thereof.

Figure 14:
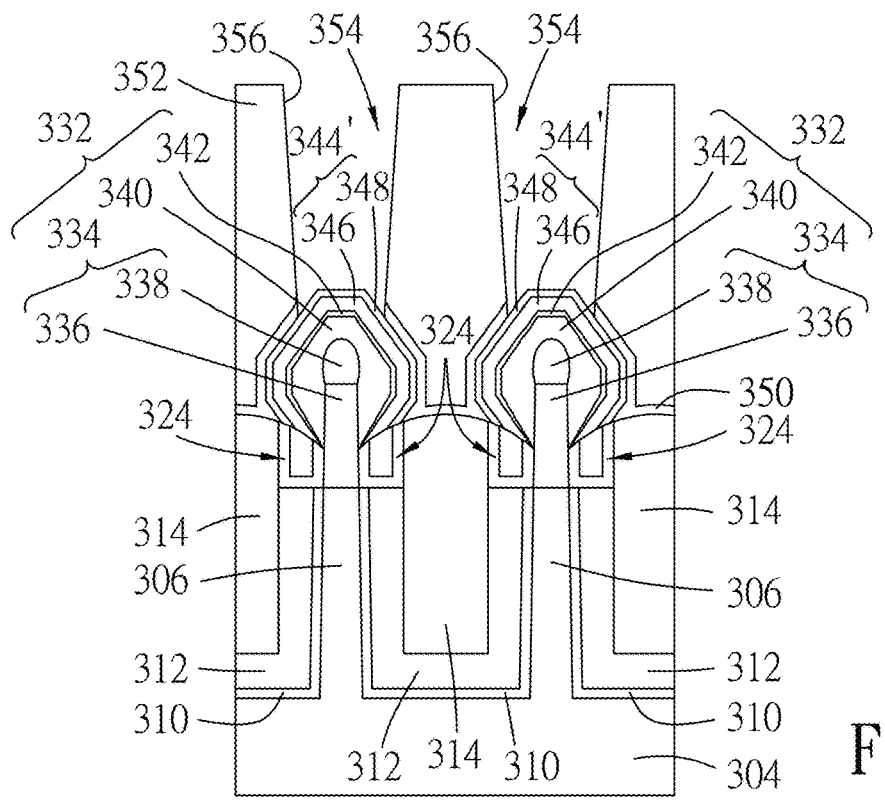
Figure 15:
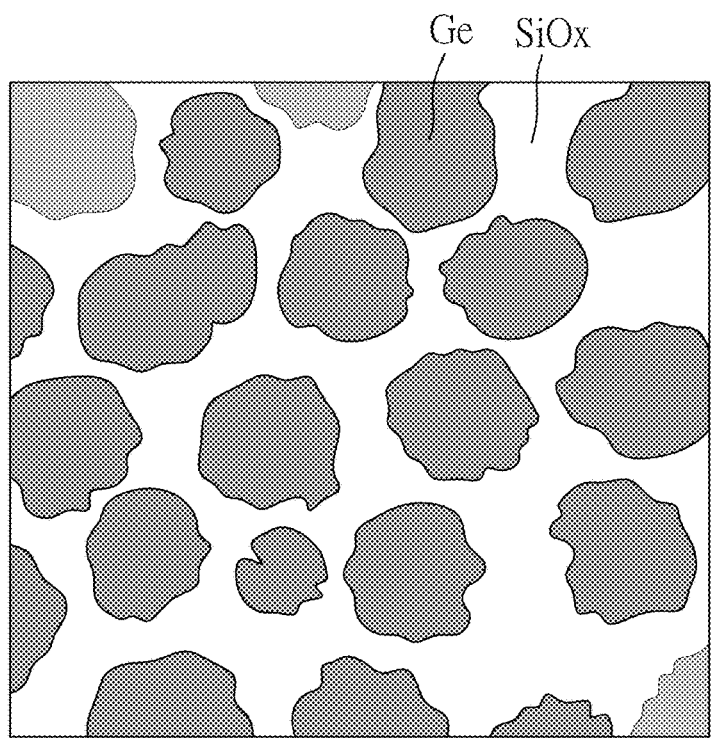

Referring to FIG. 1, in some embodiments, after the replacement metal gate process, a plurality of openings are formed in the interlayer dielectric layer. Referring to FIG. 14, in some embodiments, the openings 354 are formed in the interlayer dielectric layer 352 to penetrate the interlayer dielectric layer 352 and the contact etch stop layer 350, such that the second oxidized layers 348 of the oxidized sacrificial layers 344' are respectively exposed from the openings 354. In some embodiments, the openings 354 may be formed by anisotropic dry etching, wet etching, other suitable techniques, or any combination thereof. In some embodiments, the openings 354 may be respectively defined by side walls 356 of the interlayer dielectric layer 352. Referring to FIGS. 14 and 15, in some embodiments, Ge may be detected in the SiOx matrix of the oxidized sacrificial layers 344'.

Figure 16:
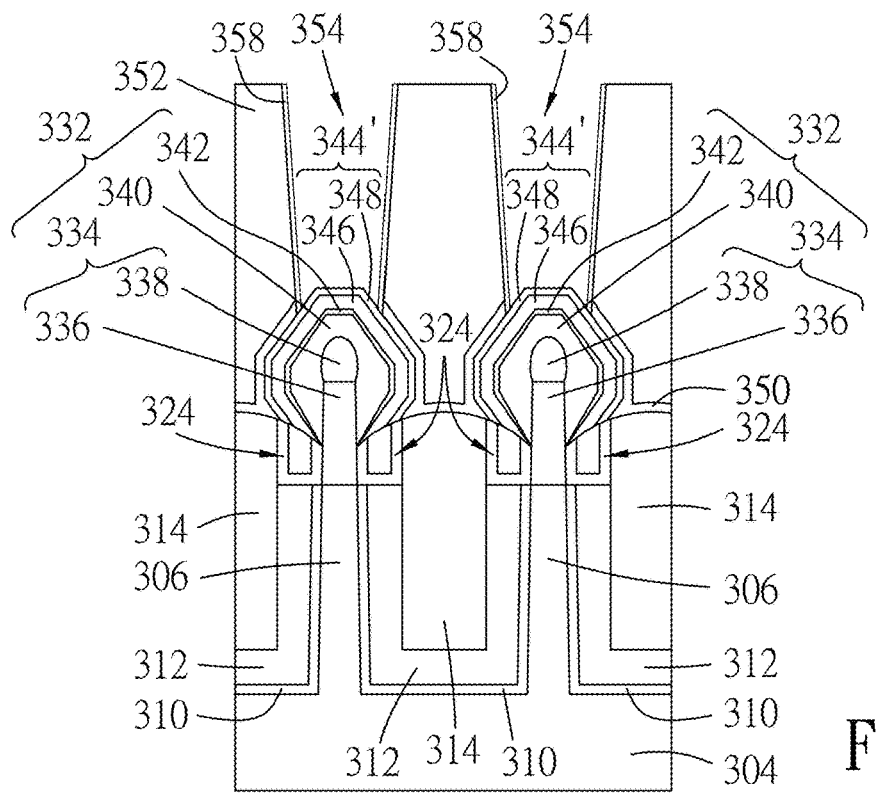

Referring to FIG. 1, in some embodiments, after the formation of the openings, the method 200 proceeds to step 214, where a plurality of protection layers are formed. Referring to FIG. 16, each of the protection layers 358 may be formed in a respective one of the openings 354 and on a respective one of the side walls 356 (see FIG. 14). In some embodiments, the protection layers 358 may be made of silicon nitride, other suitable materials, or any combination thereof. In some embodiments, the protection layers 358 may be made by ALD, CVD, PVD, other suitable techniques, or any combination thereof. In some embodiments, the protection layers 358 may be made by forming a blanket layer over the interlayer dielectric layer 352, covering the side walls 356, and over the second oxidized layers 348 of the oxidized sacrificial layers 344', followed by removing the blanket layer over the interlayer dielectric layer 352 and the second oxidized layers 348 of the oxidized sacrificial layers 344' by dry etching, wet etching, other suitable techniques, or any combination thereof, thereby forming the protection layers 358.

Figure 17:
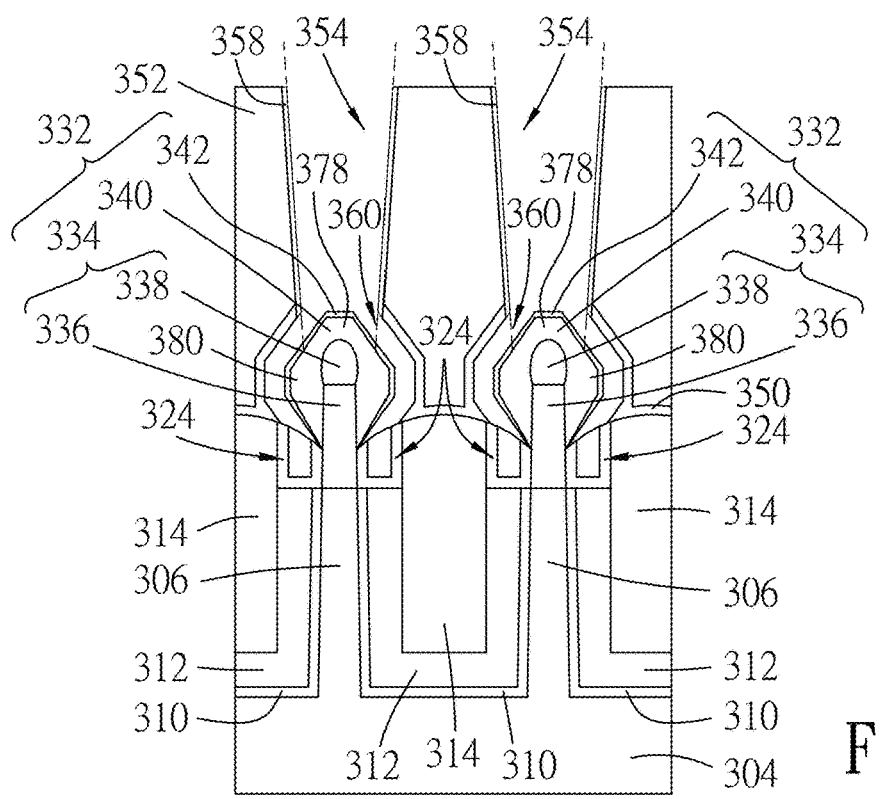

Referring to FIG. 1, in some embodiments, after the formation of the protection layers, the method proceeds to a step 216, where the oxidized sacrificial layers are removed. Referring to FIGS. 16 and 17, the oxidized sacrificial layers 344', each including the first oxidized layer 346 and the second oxidized layer 348, is removed to form a space 360. In some embodiments, the spaces 360 respectively surround the epitaxial structures 332. In some embodiments, the oxidized sacrificial layers 344' may be removed by wet chemical etching, other suitable techniques, or any combination thereof. In some embodiments, the oxidized sacrificial layers 344' may be removed by HCl at a temperature ranging from about 300° C. to about 700° C., but other range of values are also within the scope of this disclosure. In some embodiments, if the temperature of HCl is too low, such as lower than about 300° C., the oxidized sacrificial layers 344' may not be thoroughly removed. In some embodiments, if the temperature of HCl is too high, such as higher than about 700° C., the epitaxial structures 332 may be over-etched. In some embodiments, after the removal of the oxidized sacrificial layers 344', there might be Ge residue left on outer surfaces of the epitaxial structures 332.

After the removal of the oxidized sacrificial layers 344', a pre-silicide implantation process may be performed for facilitating subsequent silicide growth. In some embodiments, during the pre-silicide implantation process, portions of the epitaxial structures 332 exposed from the openings 354 may be implanted with Ge, B, other suitable dopants, or any combination thereof. As shown in FIG. 17, in some embodiments, each of the epitaxial structures 332 includes a first portion 378 that is exposed from a respective one of the openings 354 (e.g., exposed from the dash lines shown in FIG. 17), and a second portion 380 that is connected to the first portion 378 and that is not exposed from the corresponding one of the openings 354. During the pre-silicide implantation process, the first portion 378 of each of the epitaxial structures 332 is implanted with the dopant(s) while the second portion 380 of each of the epitaxial structures 332 may not be implanted. That is, the first portion 378 of each of the epitaxial structures 332 is an implanted portion, and the second portion 380 is a portion outside of the implanted portion. Then, a pre-silicide clean process may be performed to clean the outer surface of the epitaxial structures 332. In some embodiments, the epitaxial structures 332 may be cleaned by using an ammonia plasma, hydrofluoric acid plasma, liquid hydrofluoric acid, other suitable etchants, or any combination thereof.

Figure 18:
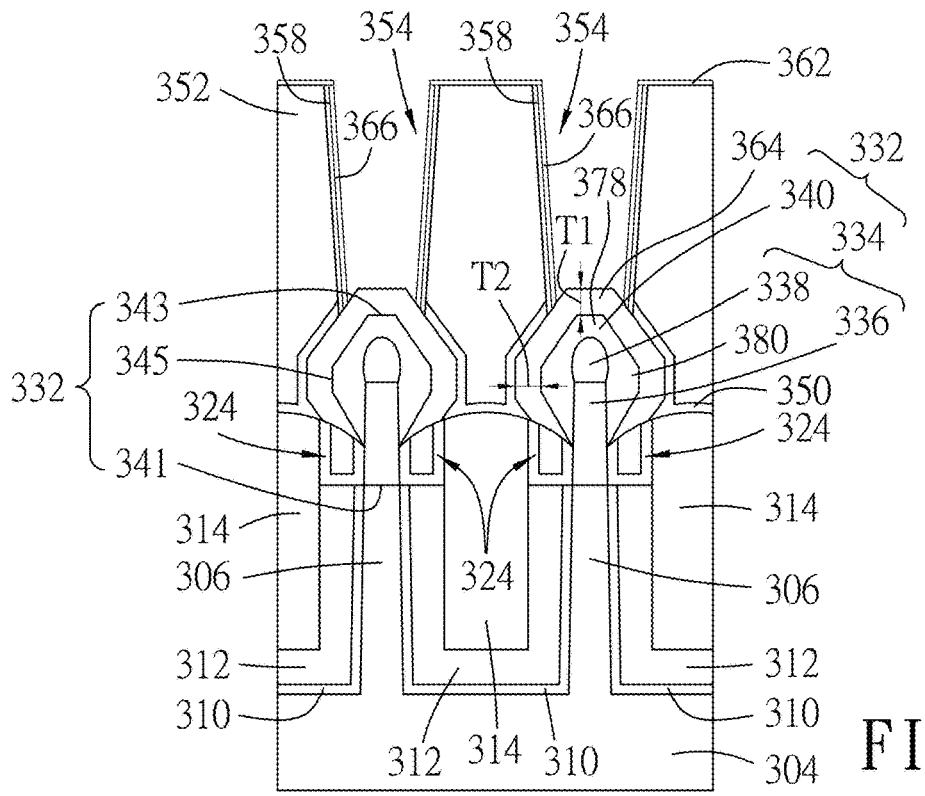

Referring to FIG. 1, the method 200 proceeds to a step 218, where a plurality of silicide structures are formed. Referring to FIG. 18, in some embodiments, a metal layer 362 is formed on the epitaxial structures 332, on the protection layers 358, and over the interlayer dielectric layer 352. In some embodiments, the metal layer 362 may be made of Ti, Ni, Co, other suitable materials, or any combination thereof. In some embodiments, the metal layer 362 may be formed under an elevated temperature, or thermal annealing may be performed after the formation of the metal layer 362. Therefore, the epitaxial structures 332 react with the metal layer 362 to form a plurality of the silicide structures 364 in the spaces 360 (see FIG. 17). In some embodiments, the third epitaxial layer 342 of each of the epitaxial structures 332 may react with the metal layer 362 to be formed into a part of the silicide structures 364. In some embodiments, the silicide structures 364 may be made of NiSi, TiSi, TiNiSi, TiSiGe, NiSiGe, TiNiSiGe, other suitable materials, or any combination thereof, depending on practical selection of materials. In some embodiments, some elements, such as germanium, may be left at the outermost surfaces of the epitaxial structures 332 after the removal of the oxidized sacrificial layers 344' (see FIG. 16). Therefore, portions of the silicide structures 364 contacting the epitaxial structures 332 may contain such elements. In addition, in some embodiments, the metal layer 362 on the protection layers 358 may react with the protection layers 358 to be formed into a plurality of metal silicide layers 366 respectively on the protection layers 358. When the protection layers 358 are exemplarily made of SiN and when the metal layer 362 is exemplarily made of Ti, the resulting metal silicide layers 366 are made of TiSiN, but other materials are also possible according to practical selection of materials. In some embodiments, the metal layer 362 over the interlayer dielectric layer 352 may not react and may remain on the interlayer dielectric layer 352.

Referring to FIGS. 10, 17 and 18, in some embodiments, each of the sacrificial layers 344 may have a thickness ranging from about 3 nm to about 10 nm, but other range of values are also within the scope of this disclosure. In some embodiments, the thickness of each of the sacrificial layers 344 may range from about 3 nm to about 5 nm, may range from about 5 nm to about 7 nm, may range from about 7 nm to about 9 nm, may range from about 9 nm to about 10 nm, or may be in other ranges. In some embodiments, if the thickness of each of the sacrificial layers 344 is too small, such as smaller than about 3 nm, the silicide structures 364 may not be properly and/or uniformly formed in the spaces 360. In some embodiments, if the thickness of each of the sacrificial layers 344 is too large, such as larger than about 10 nm, the overall dimensions of the subsequently grown silicide structures 364 may be too large, and adjacent silicide structures 364 may merge together when they need to remain separated.

As shown in FIG. 18, in some embodiments, each of the silicide structures 364 may have a first portion 3641 (e.g., a top portion) and a second portion 3642 (e.g., a side portion), where the first portion 3641 is connected to the first portion 378 of a corresponding one of the epitaxial structures 332 that is implanted in the pre-silicide implantation process, and the second portion 3642 is connected to the second portion 380 of the corresponding one of the epitaxial structures 332 which is outside of the first portion 378 and which is not implanted in the pre-silicide implantation process. In some embodiments, the first portion 3641 of each of the silicide structures 364 has a thickness (T1) larger than a thickness (T2) of the second portion 3642 of the silicide structure 364. Such differences in thickness may be the result of pre-silicide implantation process, where the first portions 378 of the epitaxial structures 332 exposed from the openings 354 are implanted for facilitating the growth of silicide structures while the second portions 380 of the epitaxial structures 332 are not directly exposed from the openings 354 and may therefore not be implanted. However, in other embodiments, the thickness (T1) of the first portion 3641 of each of the silicide structures 364 and the thickness (T2) of the second portion 3642 of the silicide structure 364 may be substantially equal to each other. In some embodiments, a ratio of T1 to T2 may range from about 1 to 5, but other range of values are also within the scope of this disclosure. In some embodiments, if the ratio of T1 to T2 is too small, such as smaller than about 1, the first portion 3641 of each of the silicide structures 364 may be too thin, leading to high resistance in the resulting semiconductor device 300 (see FIG. 19). In some embodiments, if the ratio of T1 to T2 is too large, such as larger than about 5, the second portion 3642 of each of the silicide structures 364 may be too thin, which may also lead to high resistance in the resulting semiconductor device 300, and/or the first portion 3641 of each of the silicide structures 364 may be too thick, which will occupy the space designated for the conductive structures 368 (see FIG. 19) that will be formed subsequently, and also lead to high resistance in the resulting semiconductor device 300. In some embodiments, each of the epitaxial structures 332 includes a first surface 341 (e.g., a bottom surface) that is connected to a respective one of the fins 306 (in some embodiments, when the fins 306 are omitted, the first surface 341 of each of the epitaxial structures 332 may be connected to the semiconductor substrate 304), a second surface 343 (e.g., a top surface) that is opposite to the first surface 341 and/or opposite to the semiconductor substrate 304, and a third surface 345 (e.g., a side surface) that is connected between the first and second surfaces 341, 343 (e.g., located between the first and second surfaces 341, 343). In some embodiments, each of the silicide structures 364 is connected to and covers the second and third surfaces 343, 345 (i.e., surrounds or encloses the second and third surfaces 343, 345) of a respective one of the epitaxial structures 332.

Figure 19:
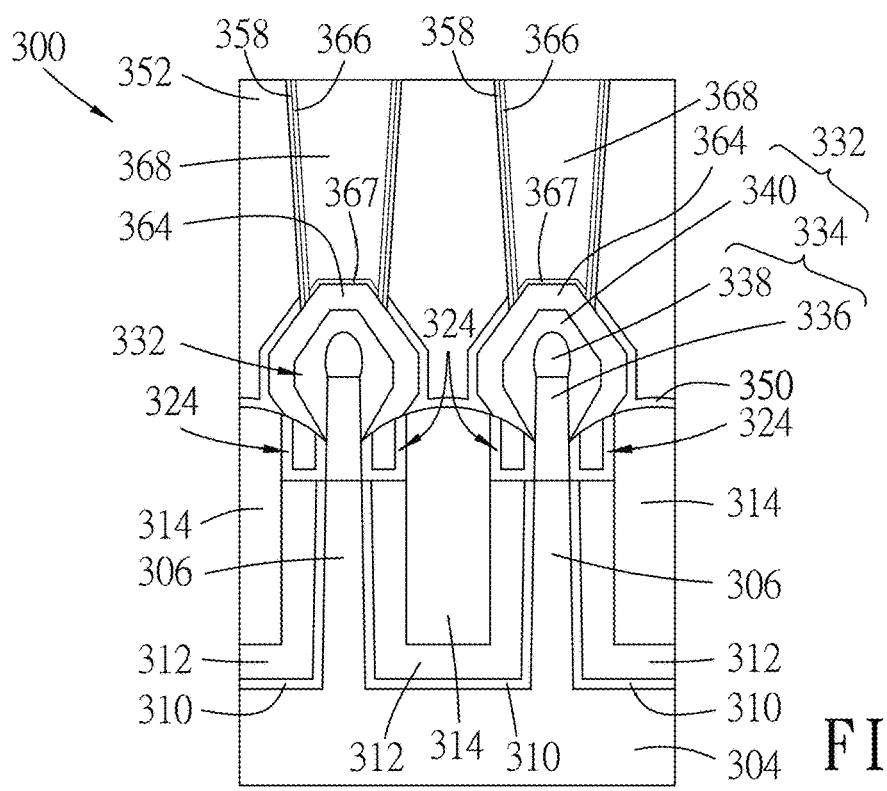

Referring to FIG. 1, after the formation of the silicide structures, the method 200 proceeds to a step 220, where a plurality of the conductive structures are formed. Referring to FIGS. 18 and 19, in some embodiments, a conductive material is formed to fill the openings 354 and over the metal layer 362, followed by removing the conductive material over the metal layer 362 to form a plurality of the conductive structures 368, which are respectively disposed in the openings 354 and which are respectively and electrically connected to the silicide structures 364. The semiconductor device 300 is thus obtained. In some embodiments, the conductive materials (i.e., conductive structures 368) may be made of W, Al, Cu, Co, Ti, Ta, TiN, TaN, NiSi, CoSi, CuSi, TaC, TaSiN, TaCN, TiAl, TiAlN, other suitable materials, or any combination thereof. In some embodiments, the conductive material may be formed by PVD, CVD, plating (including electroplating, electroless plating, etc.), other suitable techniques, or any combination thereof. In some embodiments, the process of removing the conductive material over the metal layer 362 may be performed using CMP, etching back, other suitable techniques, or any combination thereof. In some embodiments, the metal layer 362 may also be removed, thereby exposing the interlayer dielectric layer 352. In some embodiments, before the formation of the conductive structures 368, the silicide structures 364 may be subjected to a nitridation process (e.g., $NH_3$ plasma treatment) to form a plurality of cover layers 367 respectively on the silicide structures 364 for protecting the silicide structures 364 in the subsequent processes. In some embodiments, when the silicide structures 364 are exemplarily made of TiSi, the cover layers 367 may be made of TiSiN.

Figure 20:
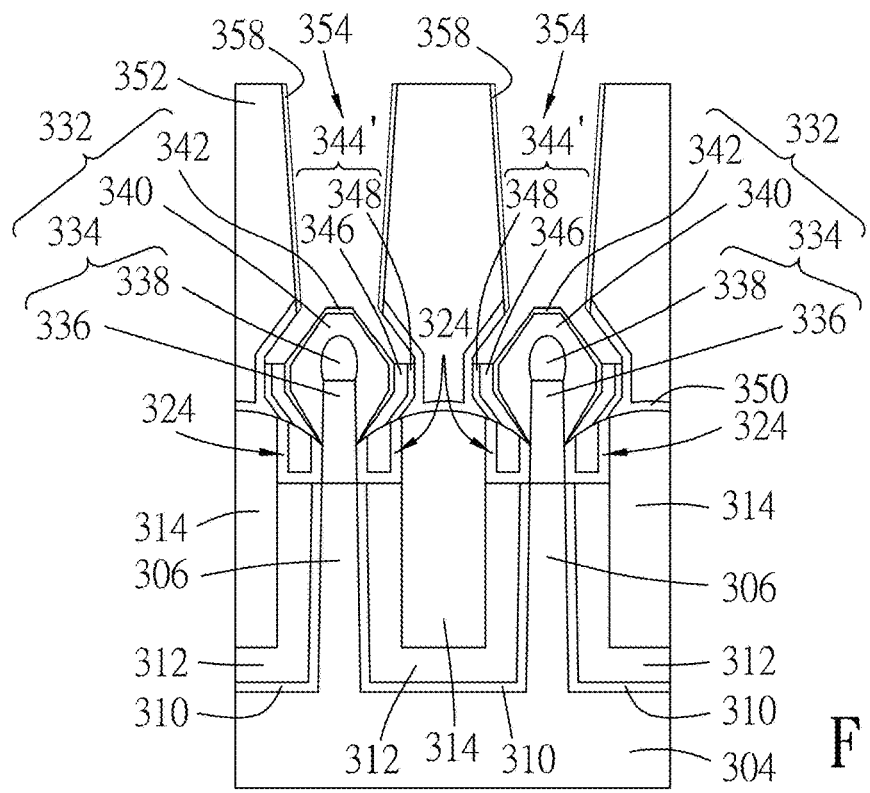
FIGS. 20 to 25 show variations of a semiconductor device in accordance with some embodiments of this disclosure.
Figure 21:
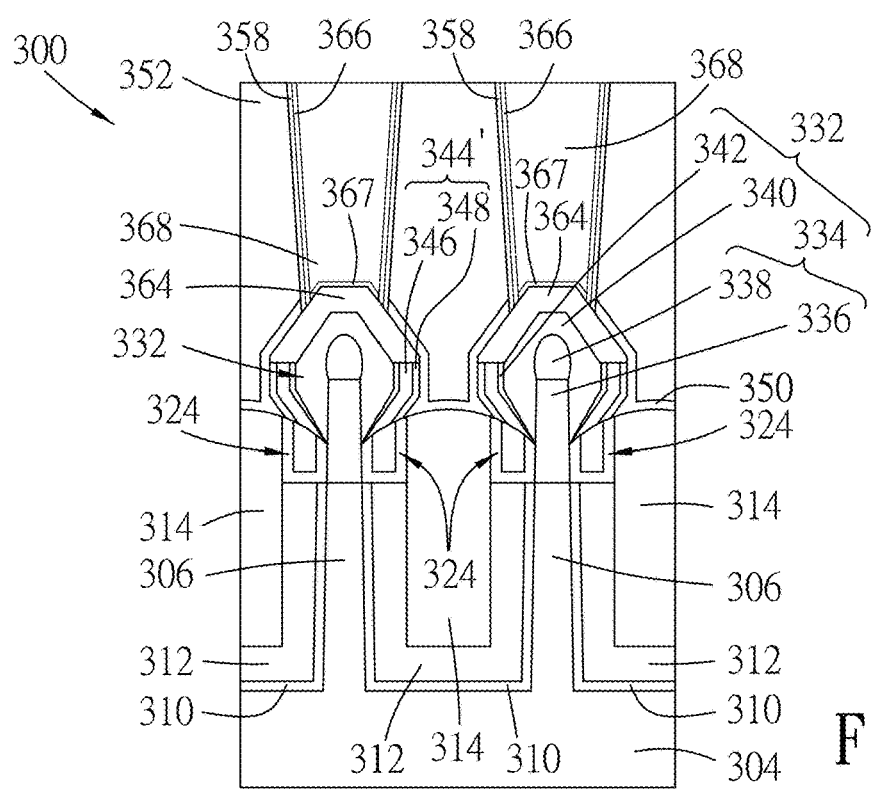
Figure 22:
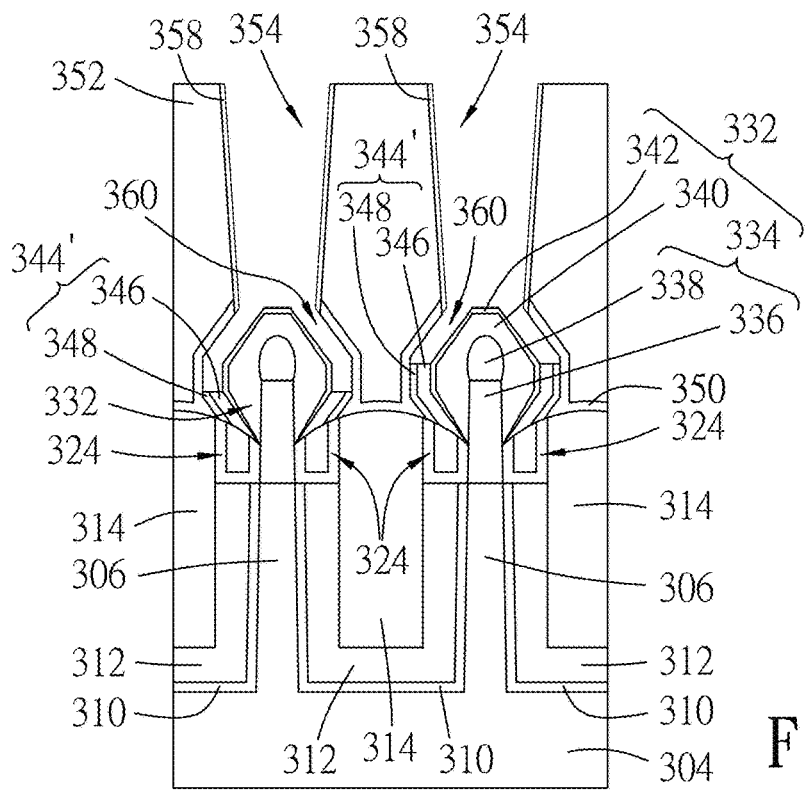
Figure 23:
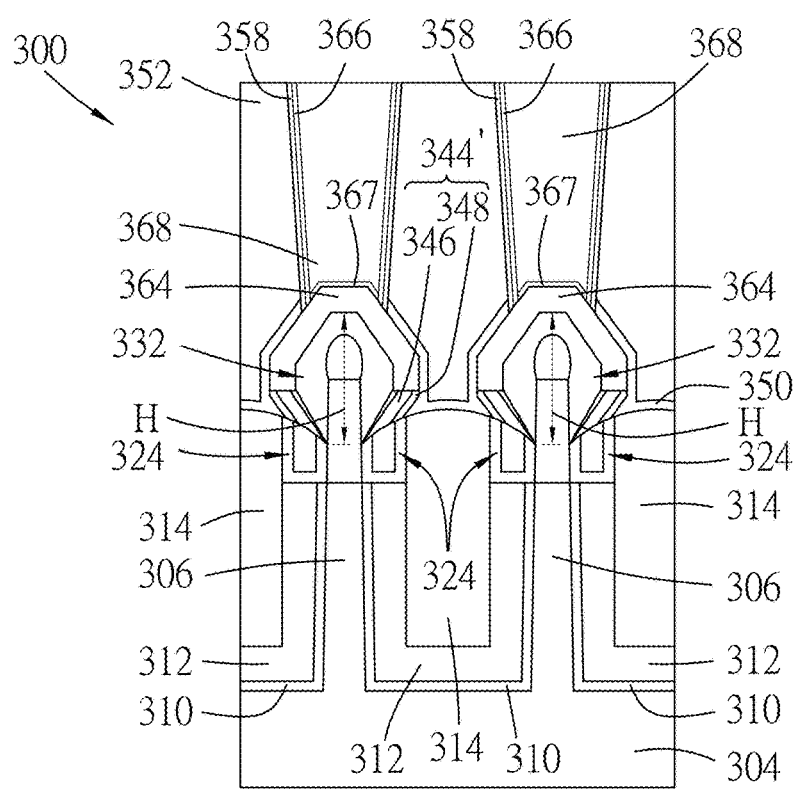
Figure 24:
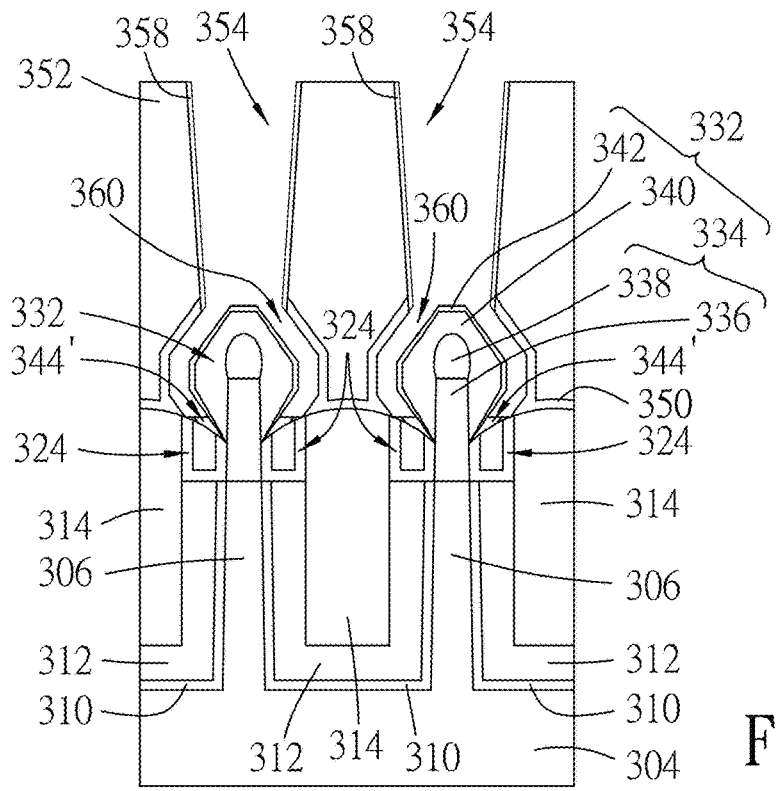
Figure 25:
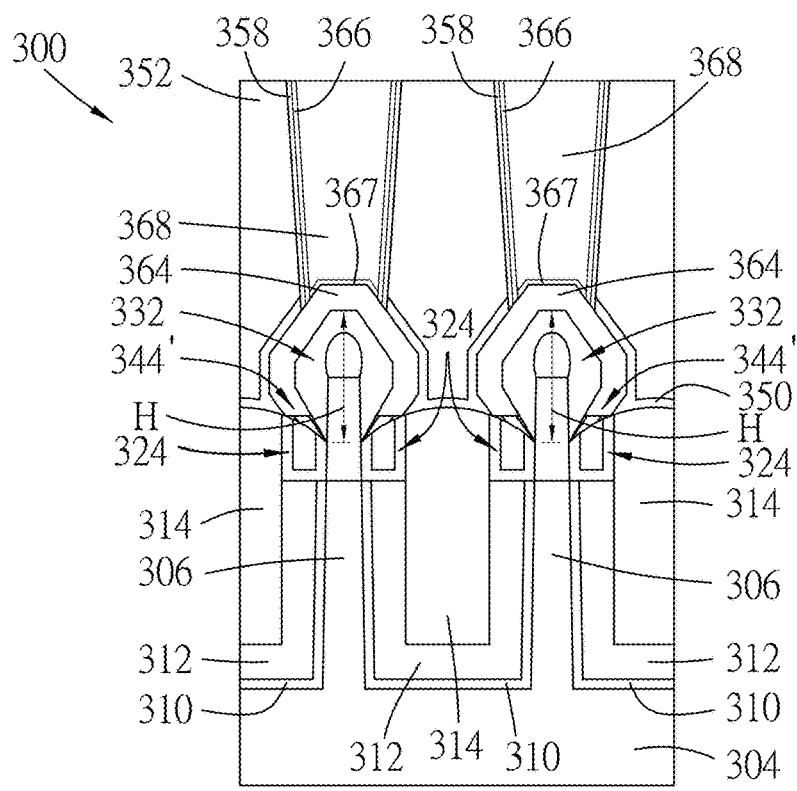

Referring to FIGS. 1, 20, 22 and 24, in some embodiments, after the step 216 of removing the oxidized sacrificial layers, there may be residues of the oxidized sacrificial layers 344' left at bottom portions of the spaces 360 (as shown in FIGS. 20, 22 and 24). FIGS. 21, 23 and 25 respectively show that the structures of FIGS. 20, 22 and 24 undergo steps 218 and 220 of FIG. 1 to obtain the semiconductor devices 300. As shown in FIGS. 21, 23 and 25, in some embodiments, the residue of each of the oxidized sacrificial layers 344' is connected to a corresponding one of the epitaxial structures 332, and is disposed between a corresponding one of the silicide structures 364 and the semiconductor structure 304, where, in some embodiments, the residue of each of the oxidized sacrificial layers 344' may be made of silicon germanium oxide (i.e., may contain germanium). As shown in FIGS. 23 and 25, in some embodiments, the residue of each of the oxidized sacrificial layers 344' may be located below one-half of the height (H) of the corresponding one of the epitaxial structures 332.

Figure 27:
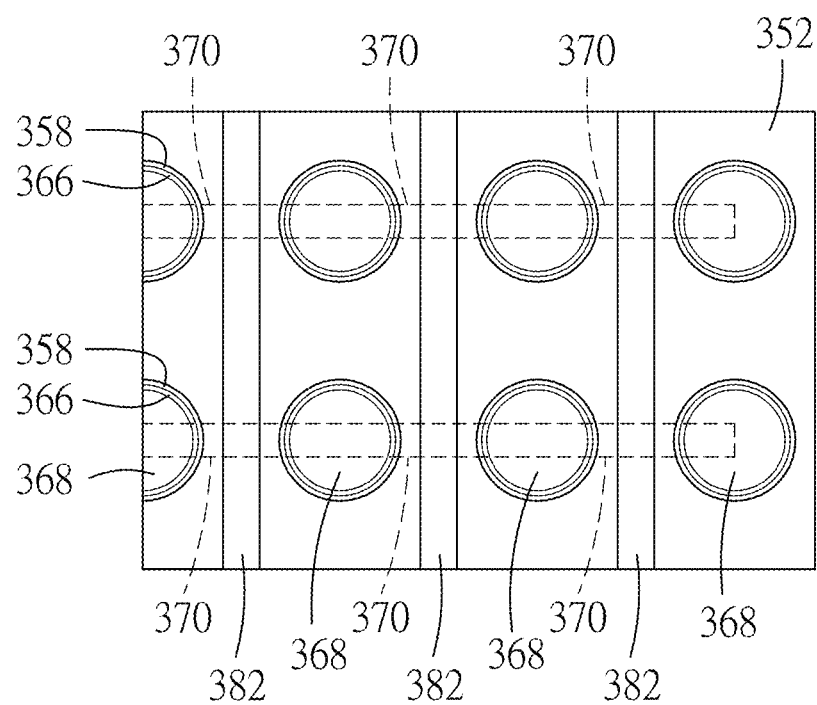
FIG. 27 is a top view of FIG. 26, showing a plurality of channels of a semiconductor device in accordance with some embodiments of this disclosure.

Referring to FIGS. 19, 26 and 27, in some embodiments, the semiconductor device 300 may include the semiconductor substrate 304, the fins 306 that are disposed above the semiconductor substrate 304, a plurality of channel regions 370 that are respectively formed in the fins 306 and that are disposed on or above the semiconductor substrate 304, the gate structures 372 that are disposed on the semiconductor substrate 304 and over the channel regions 370, a plurality of epitaxial structures 332, and a plurality of silicide structures 364. In some embodiments, the semiconductor device 300 further includes a plurality of hard mask layers 382 respectively disposed on the gate structures 372. For each of the channel regions 370, two corresponding ones of the epitaxial structures 332 are connected at opposite ends of the channel region 370 and are disposed opposite to each other relative to a corresponding one of the gate structures 372, and two corresponding ones of the silicide structures 364 respectively surround the two corresponding ones of the epitaxial structures 332. In some embodiments, the semiconductor device 300 further includes a plurality of cover layers 367 that are respectively disposed on the silicide structures 364, a plurality of the conductive structures 368 that are disposed over the semiconductor substrate 304 and that are respectively connected to the silicide structures 364 (e.g., through the cover layers 367), a plurality of the metal silicide layers 366 that respectively surround the conductive structures 368, and a plurality of the silicon nitride protection layers 358 that respectively surround the metal silicide layers 366. Although, in FIG. 26, the semiconductor device 300 is exemplified to be a fin field-effect transistor (FinFET) device, the semiconductor device 300 may be a gate-all-around (GAA) transistor device, a nanosheet transistor device, or other suitable devices. Although, in FIG. 26, each of the conductive structures 368 is exemplified to be connected to a respective one of the silicide structures 364, each of the conductive structures 368 may be connected to multiple silicide structures 364 in other embodiments.

The embodiments of the present disclosure have some advantageous features. With the silicide structure 364 surrounding or enclosing the epitaxial structure 332, the contact resistance of the semiconductor device 300 may be decreased since there is a larger contact area between the silicide structure 364 and the epitaxial structure 332. In embodiments where there are residues of the oxidized sacrificial layer 344', the contact area is still increased with the silicide structure 364 partially surrounding the epitaxial structure 332.

In accordance with some embodiments of the present disclosure, a semiconductor device includes a semiconductor substrate, a channel region, a gate structure, two epitaxial structures, and two silicide structures. The channel region is disposed on the semiconductor substrate. The gate structure is disposed on the semiconductor substrate and over the channel region. The epitaxial structures are connected at opposite ends of the channel region and are disposed opposite to each other relative to the gate structure. The silicide structures respectively surround the epitaxial structures.

In accordance with some embodiments of the present disclosure, the channel region is disposed above the semiconductor substrate.

In accordance with some embodiments of the present disclosure, the semiconductor device further includes a fin that is disposed above the semiconductor substrate. The channel region is formed in the fin.

In accordance with some embodiments of the present disclosure, the semiconductor device further includes at least one oxidized sacrificial layer that is connected to one of the epitaxial structures, and that is disposed between a corresponding one of the silicide structures and the semiconductor structure.

In accordance with some embodiments of the present disclosure, the at least one oxidized sacrificial layer contains germanium.

In accordance with some embodiments of the present disclosure, the at least one oxidized sacrificial layer is made of silicon germanium oxide.

In accordance with some embodiments of the present disclosure, the at least one oxidized sacrificial layer is located below one-half of the height of the corresponding one of the epitaxial structures.

In accordance with some embodiments of the present disclosure, each of the silicide structures has a first portion that is connected to a first portion of a corresponding one of the epitaxial structures, and a second portion that is connected to a second portion of the corresponding one of the epitaxial structures outside of the first portion of the corresponding one of the epitaxial structures. The first portion of each of the silicide structures has a thickness that is larger than a thickness of the second portion of the silicide structure.

In accordance with some embodiments of the present disclosure, each of the epitaxial structures includes a first surface that is connected to the semiconductor substrate, a second surface that is opposite to the first surface, and a third surface that is connected between the first and second surfaces. Each of the silicide structures is connected to and covers the second and third surfaces of the respective one of the epitaxial structures.

In accordance with some embodiments of the present disclosure, a semiconductor device includes a semiconductor substrate, a channel region, a gate structure, two epitaxial structures, and two silicide structures. The channel region is disposed above the semiconductor substrate. The gate structure is disposed on the semiconductor substrate and over the channel region. The epitaxial structures is connected at opposite ends of the channel region and is disposed opposite to each other relative to the gate structure. Each of the epitaxial structures includes a first surface that is connected to the semiconductor substrate, a second surface that is opposite to the semiconductor substrate, and a third surface that is connected and located between the first and second surfaces. The silicide structures respectively surround the epitaxial structures. Each of the silicide structures is connected to the second and third surfaces of the respective one of the epitaxial structures.

In accordance with some embodiments of the present disclosure, the semiconductor device further includes at least one oxidized sacrificial layer that is connected to the second surface of one of the epitaxial structures, that is disposed between a corresponding one of the silicide structures and the semiconductor substrate, and that contains germanium.

In accordance with some embodiments of the present disclosure, the at least one oxidized sacrificial layer is located below one-half of the height of the corresponding one of the epitaxial structures.

In accordance with some embodiments of the present disclosure, each of the silicide structures has a first portion and a second portion disposed between the first portion and the semiconductor substrate. The first portion of each of the silicide structures has a thickness that is larger than a thickness of the second portion of the silicide structure.

In accordance with some embodiments of the present disclosure, a method of manufacturing a semiconductor device includes: forming a semiconductor structure including a semiconductor substrate, a channel region disposed on the semiconductor substrate, and two epitaxial structures connected at opposite ends of the channel region; forming two sacrificial layers respectively enclosing the epitaxial structures; oxidizing the epitaxial structures into two oxidized sacrificial layers; forming a contact etch stop layer surrounding the oxidized sacrificial layers; forming an interlayer dielectric layer over the contact etch stop layer; forming two openings in the interlayer dielectric layer to penetrate the contact etch stop layer, so that the oxidized sacrificial layers are respectively exposed from the openings; removing at least a part of the oxidized sacrificial layers to form two spaces respectively surrounding the epitaxial structures; forming two silicide structures respectively in the spaces to respectively enclose the epitaxial structures; and forming two conductive structures respectively in the openings to respectively connected to the silicide structures.

In accordance with some embodiments of the present disclosure, in the step of forming the semiconductor structure, each of the epitaxial structures includes an outermost layer that is made of silicon germanium with a germanium content being less than about 25 atomic percent. In the step of forming the sacrificial layers, each of the sacrificial layers is made of silicon germanium with a germanium content ranging from about 30 atomic percent to about 80 atomic percent. In in the step of oxidizing the epitaxial structures, the oxidation reaction terminates at the outermost layer of each of the epitaxial structures.

In accordance with some embodiments of the present disclosure, in the step of removing at least a part of the oxidized sacrificial layers, at least one residue of the oxidized sacrificial layers is left at the bottom portion of a corresponding one of the spaces, and is connected to a corresponding one of the epitaxial structures. In the step of forming the silicide structures, the at least one residue of the oxidized sacrificial layers is disposed between a corresponding one of the silicide structures and the semiconductor structure.

In accordance with some embodiments of the present disclosure, in the step of removing the at least a part of the oxidized sacrificial layers, the at least one residue of the oxidized sacrificial layers contains germanium.

In accordance with some embodiments of the present disclosure, the at least a part of the oxidized sacrificial layers are removed in such a manner that the at least one residue of the oxidized sacrificial layers is located below one-half of the height of the corresponding one of the epitaxial structures.

In accordance with some embodiments of the present disclosure, after the step of removing the at least a part of the oxidized sacrificial layers and before the step of forming the silicide structures, portions of the epitaxial structures exposed from the openings are implanted with dopants. The silicide structures are formed in such a manner that each of the silicide structures has a first portion that is connected to an implanted portion of a corresponding one of the epitaxial structures and a second portion that is connected to a portion of the corresponding one of the epitaxial structures outside of the implanted portion of the corresponding one of the epitaxial structures, the first portion of each of the silicide structures having a thickness that is larger than a thickness of the second portion of the silicide structure.

In accordance with some embodiments of the present disclosure, in the step of forming the semiconductor structure, each of the epitaxial structures is formed to includes a first surface that is connected to the semiconductor substrate, a second surface that is opposite to the first surface, and a third surface that is connected and located between the first and second surfaces. In the step of forming the silicide structures, each of the silicide structures is formed to be connected to and cover the second and third surfaces of the respective one of the epitaxial structures.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   forming a semiconductor structure including a semiconductor substrate, a channel region disposed on the semiconductor substrate, and two epitaxial structures connected at opposite ends of the channel region;
   forming two sacrificial layers respectively enclosing the two epitaxial structures;
   oxidizing the two sacrificial layers into two oxidized sacrificial layers;
   forming a contact etch stop layer surrounding the two oxidized sacrificial layers;
   forming an interlayer dielectric layer over the contact etch stop layer;
   forming two openings in the interlayer dielectric layer to penetrate the contact etch stop layer, so that the two oxidized sacrificial layers are respectively exposed from the two openings;
   removing at least a part of the two oxidized sacrificial layers to form two spaces respectively surrounding the two epitaxial structures;

forming two silicide structures respectively in the two spaces to respectively enclose the two epitaxial structures; and forming two conductive structures respectively in the two openings so that the two conductive structures are respectively connected to the two silicide structures, wherein:

after removing the at least a part of the two oxidized sacrificial layers and before the step of forming the two silicide structures, portions of the two epitaxial structures exposed from the two openings are implanted with dopants; and the two silicide structures are formed in such a manner that each of the two silicide structures has a first portion that is connected to an implanted portion of a corresponding one of the two epitaxial structures and a second portion that is connected to a portion of the corresponding one of the two epitaxial structures outside of the implanted portion of the corresponding one of the two epitaxial structures, in each of the two silicide structures, the first portion having a thickness that is larger than a thickness of the second portion.

2. The method as claimed in claim 1, wherein:

in forming the semiconductor structure, each of the two epitaxial structures includes an outermost layer that is made of silicon germanium with a germanium content being less than 25 atomic percent;

in forming the two sacrificial layers, each of the two sacrificial layers is made of silicon germanium with a germanium content ranging from 30 atomic percent to 80 atomic percent; and in oxidizing the two sacrificial layers, an oxidation reaction terminates at the outermost layer of each of the two epitaxial structures.

3. The method as claimed in claim 1, wherein:

in removing the at least a part of the two oxidized sacrificial layers, at least one residue of the two oxidized sacrificial layers is left at the bottom portion of a corresponding one of the two spaces and is connected to a corresponding one of the two epitaxial structures; and in forming the two silicide structures, the at least one residue of the two oxidized sacrificial layers is disposed between a corresponding one of the two silicide structures and the semiconductor structure.

4. The method as claimed in claim 3, wherein, in removing the at least a part of the two oxidized sacrificial layers, the at least one residue of the two oxidized sacrificial layers contains germanium.

5. The method as claimed in claim 3, wherein the at least a part of the two oxidized sacrificial layers are removed in such a manner that the at least one residue of the two oxidized sacrificial layers is located below one-half of the height of the corresponding one of the two epitaxial structures.

6. The method as claimed in claim 1, wherein:

in forming the semiconductor structure, each of the two epitaxial structures is formed to include a first surface that is connected to the semiconductor substrate, a second surface that is opposite to the first surface, and a third surface that is connected and located between the first surface and the second surface; and in forming the two silicide structures, each of the two silicide structures is formed to be connected to and covers the second surface and the third surface of the respective one of the two epitaxial structures.

7. A method of manufacturing a semiconductor device comprising:

forming two epitaxial structures on a semiconductor structure such that the two epitaxial structures are located at two opposite sides of a channel region of the semiconductor structure, each of the two epitaxial structures having a lower surface that is connected to the semiconductor structure, an upper surface that is opposite the lower surface in a vertical direction, and a side surface that interconnects the upper surface and the lower surface;

forming two sacrificial layers each of which covers the upper surface and the side surface of a respective one of the two epitaxial structures;

performing an oxidation process to form the two sacrificial layers into two oxidized sacrificial layers, each of the two oxidized sacrificial layers having
 a first portion formed on the upper surface of the respective one of the two epitaxial structures, and
 a second portion formed on the side surface of the respective one of the two epitaxial structures;

forming a dielectric portion over the two oxidized sacrificial layers;

forming two openings in the dielectric portion so that the first portion of each of the two oxidized sacrificial layers is exposed from a respective one of the two openings, and the second portion of each of the two oxidized sacrificial layers is covered by the dielectric portion;

performing a removal process to remove the first portion of each of the two oxidized sacrificial layers, and to remove at least a part of the second portion of each of the two oxidized sacrificial layers;

after the removal process, forming two silicide structures respectively over the two epitaxial structures, each of the two silicide structures covering the upper surface and the side surface of the respective one of the two epitaxial structures.

8. The method as claimed in claim 7, wherein:

each of the two silicide structures covers the upper surface and an upper portion of the side surface of the respective one of the two epitaxial structures.

9. The method as claimed in claim 7, wherein each of the two silicide structures completely covers the upper surface and the side surface of the respective one of the two epitaxial structures.

10. The method as claimed in claim 7, wherein the two sacrificial layers and an outermost layer of each of the two epitaxial structures are made of silicon germanium, before the oxidation process, a germanium content of each of the two sacrificial layers being greater than a germanium content of the outermost layer of each of the two epitaxial structures.

11. The method as claimed in claim 10, wherein before the oxidation process, the germanium content of the outermost layer of each of the two epitaxial structures is less than 25 atomic percent.

12. The method as claimed in claim 7, wherein each of the two sacrificial layers has a thickness ranging from 3 nm to 10 nm.

13. The method as claimed in claim 7, wherein after the oxidation process, each of the two oxidized sacrificial layers includes a first oxidized layer that covers the upper surface and the side surface of the respective one of the two epitaxial structures, and a second oxidized layer that covers the first oxidized layer, the first oxidized layer having a germanium content higher than a germanium content of the second oxidized layer.

14. A method of manufacturing a semiconductor device comprising:

forming two epitaxial structures on a semiconductor structure such that the two epitaxial structures are located at two opposite sides of a channel region of the semiconductor structure, each of the two epitaxial structures having a lower surface that is connected to the semiconductor structure, an upper surface that is opposite the lower surface, and a side surface that interconnects the upper surface and the lower surface, the upper surface and the side surface being exposed from the semiconductor structure;

forming two oxidized sacrificial layers over the two epitaxial structures, each of the two oxidized sacrificial layers having
a first portion formed on the upper surface of the respective one of the two epitaxial structures, and
a second portion formed on the side surface of the respective one of the two epitaxial structures;

forming an interlayer dielectric layer over the two epitaxial structures, the two oxidized sacrificial layers and the semiconductor structure;

after forming the interlayer dielectric layer, forming two openings to expose the first portion of each of the two oxidized sacrificial layers while the second portion of each of the two oxidized sacrificial layers is covered by the interlayer dielectric layer;

removing the two oxidized sacrificial layers so that the two epitaxial structures are spaced apart from the interlayer dielectric layer by two spaces respectively, each of the two spaces extending from a respective one of the two openings into the second portion of a respective one of the two oxidized sacrificial layers; and forming two silicide structures respectively in the two openings to respectively fill the two spaces so that the upper surface and the side surface of each of the two epitaxial structures are in contact with a respective one of the two silicide structures.

15. The method as claimed in claim 14, wherein in removing the two oxidized sacrificial layers, the first portion and an upper part of the second portion of each of the two oxidized sacrificial layers is removed, leaving a lower part of the second portion of each of the two oxidized sacrificial layers covering a lower portion of the side surface of a respective one of the two epitaxial structures.

16. The method as claimed in claim 14, wherein in forming the two oxidized sacrificial layers, an outermost layer of each of the two epitaxial structures is oxidized.

17. The method as claimed in claim 14, wherein forming the two oxidized sacrificial layers sequentially includes:

depositing two sacrificial layers over the two epitaxial structures, such that the upper surface and the side surface of each of the two epitaxial structures are covered by a respective one of the two sacrificial layers, and performing an oxidation process to at least partially remove germanium in each of the two sacrificial layers such that the two sacrificial layers are formed into the two oxidized sacrificial layers with porous structures.

18. The method as claimed in claim 14, wherein each of the two oxidized sacrificial layers includes a first oxidized layer enclosing a respective one of the two epitaxial structures, and a second oxidized layer enclosing the first oxidized layer, and having a germanium content less than a germanium content of the first oxidized layer.

19. The method as claimed in claim 14, wherein the two oxidized sacrificial layers are removed by hydrogen chloride at a temperature ranging from 300° C. to 700° C.

20. The method as claimed in claim 15, wherein the lower part of the second portion of each of the two oxidized sacrificial layers includes silicon germanium oxide.

* * * * *